(12) United States Patent
Iwata et al.

(10) Patent No.: US 7,598,559 B2
(45) Date of Patent: Oct. 6, 2009

(54) SEMICONDUCTOR STORAGE DEVICE, MANUFACTURING METHOD THEREFOR, AND PORTABLE ELECTRONIC EQUIPMENT

(75) Inventors: Hiroshi Iwata, Nara-ken (JP); Akihide Shibata, Nara (JP); Masayuki Nakano, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 293 days.

(21) Appl. No.: 11/366,479

(22) Filed: Mar. 3, 2006

(65) Prior Publication Data

US 2006/0197142 A1    Sep. 7, 2006

(30) Foreign Application Priority Data

Mar. 4, 2005    (JP) .................... P2005-060927

(51) Int. Cl.
*H01L 29/94* (2006.01)

(52) U.S. Cl. .................... 257/311; 257/310; 257/296

(58) Field of Classification Search ............. 257/296, 257/310, 311, 321, 324, E29.309
See application file for complete search history.

(56) References Cited

U.S. PATENT DOCUMENTS

| | | | | |
|---|---|---|---|---|
| 3,992,701 | A | * | 11/1976 | Abbas et al. ............. 365/184 |
| 5,885,876 | A | * | 3/1999 | Dennen ..................... 438/294 |
| 6,724,661 | B2 | | 4/2004 | Lee et al. |
| 7,262,458 | B2 | | 8/2007 | Yoshioka et al. |
| 2002/0024113 | A1 | * | 2/2002 | Hurkx et al. ............. 257/565 |
| 2004/0161890 | A1 | * | 8/2004 | Song et al. ............... 438/240 |
| 2006/0192241 | A1 | * | 8/2006 | Lee et al. ................. 257/314 |

FOREIGN PATENT DOCUMENTS

| | | |
|---|---|---|
| EP | 0 623 964 A2 | 11/1994 |
| JP | 05-145078 A | 6/1993 |
| JP | 6-318695 A | 11/1994 |
| JP | 08-088286 A | 4/1996 |
| JP | 8-330302 A | 12/1996 |
| JP | 10-321740 | 12/1998 |
| JP | 2000-4014 A | 1/2000 |
| JP | 2000-174011 A | 6/2000 |
| JP | 2002-368142 A | 12/2002 |
| JP | 2003-68893 A | 3/2003 |
| JP | 2003-92370 A | 3/2003 |
| JP | 2004-247581 * | 9/2004 |
| JP | 2004-247581 A | 9/2004 |
| JP | 2004-342927 A | 12/2004 |

OTHER PUBLICATIONS

Machine translation of JP2004-247581 is attached.*

* cited by examiner

*Primary Examiner*—Wai-Sing Louie
*Assistant Examiner*—Bilkis Jahan
(74) *Attorney, Agent, or Firm*—Birch, Stewart, Kolasch & Birch, LLP

(57) ABSTRACT

A semiconductor storage device has a semiconductor layer having a first conductivity type region and two second conductivity type regions separated from each other by the first conductivity type region, a memory function body formed on a surface of the semiconductor layer, and a gate electrode. The memory function body has a charge storage insulator and a charge retention insulator positioned between the charge storage insulator and the semiconductor layer, and doubles as a gate insulating film. The charge retention insulator contains such impurity atoms (phosphorus) as would cause an intrinsic semiconductor to be of the second conductivity type.

15 Claims, 21 Drawing Sheets

SEMICONDUCTOR STORAGE DEVICE, MANUFACTURING METHOD THEREFOR, AND PORTABLE ELECTRONIC EQUIPMENT

This nonprovisional application claims priority under 35 U.S.C. §119(a) on Patent Application No. 2005-60927 filed in Japan on Mar. 4, 2005, the entire contents of which are hereby incorporated by reference.

BACKGROUND OF THE INVENTION

The present invention relates to a semiconductor storage device, and more specifically, to a semiconductor storage device including an insulator having a function of holding electric charges, a manufacturing method therefor, and portable electronic equipment.

As nonvolatile memories using insulators having a function of trapping electric charges, there are memories having a MONOS (Metal Oxide Nitride Oxide Semiconductor) structure (see, e.g., JP 05-145078 A). As shown in FIG. 24, a MONOS (memory element 99) has a field-effect transistor structure in which diffusion regions 902, 903 that are to be source/drain regions are formed in a semiconductor substrate 901 and a gate electrode 905 is formed above a channel region between these two diffusion regions with an ONO (Oxide Nitride Oxide) film 904 disposed between the gate electrode and the channel region. The ONO film 904 is structured such that a silicon nitride film 908 is interposed in between a bottom insulating film 906 and a top oxide film 907. The quantity of electric charges trapped by the silicon nitride film 908 changes a threshold value of the memory element 99, and detecting the difference in threshold value makes it possible to read stored information.

However, regarding a memory retention characteristic when the MONOS is in an erased state (in which holes are accumulated in the silicon nitride film 908 and the threshold value is low), it is known that the threshold value increases (the read current decreases) with a lapse of time. FIGS. 25 and 26 are graphs schematically showing time (t) dependence of a threshold value (Vt) and of a read current quantity (Id), respectively, after the MONOS is put in an erased state. Such characteristics of the MONOS cause reduction in memory window (difference in read current or difference in read threshold between program (i.e., write) operation and erase operation), thereby posing a major impediment to increase in read speed or miniaturization of the elements. Such reduction in read current with a lapse of time in the MONOS is a distinctive phenomenon particularly dominantly produced in nonvolatile memory elements using insulators having a function of trapping electric charges.

SUMMARY OF THE INVENTION

An object of the present invention is to provide a semiconductor storage device excellent in charge retention characteristic and capable of suppressing reduction in read current with a lapse of time, and to provide a manufacturing method for such a semiconductor storage device, and also to provide portable electronic equipment including such a semiconductor storage device.

In order to provide a solution to the problem, a semiconductor storage device according to a first aspect of the present invention includes a semiconductor layer having, at a surface portion thereof, a first conductivity type region and two second conductivity type regions separated from each other by the first conductivity type region; a memory function body formed on a surface of the semiconductor layer and having a function of storing electric charges; and a gate electrode provided above the first conductivity type region of the semiconductor layer. And, the memory function body has a charge storage insulator having a function of storing electric charges, and a charge retention insulator positioned between the charge storage insulator and the semiconductor layer and having a function of retaining electric charges stored in the charge storage insulator. Also, such impurity atoms as would cause an intrinsic semiconductor to be of the second conductivity type are present between the charge storage insulator and a preset depth location within the first conductivity type region of the semiconductor layer.

According to the present invention, with the action of impurity atoms present between the charge storage insulator and the preset depth location in the first conductivity type region of the semiconductor layer, reduction in read current with the memory function body being in the erased state can be suppressed even after a lapse of long time. Therefore, even after stored information has been in the memory function body for a long period of time, a large memory window can be secured, which makes it possible to increase a read speed. Further, even with a smaller device size, a desired memory window can be secured. In other words, it is possible to miniaturize the memory element while maintaining the read speed.

Moreover, the semiconductor storage device in the present invention can be manufactured through manufacturing process steps for normal semiconductor devices, which facilitates a process to integrate the semiconductor storage devices of the invention and other semiconductor devices constituting a logic circuit.

The reason why the reduction in read current when the memory function body is in the erased state is suppressed is considered to be that formation of a defect causing carrier traps between the charge storage insulator S and the preset depth location in the first conductivity type region of the semiconductor layer is suppressed by the impurity atoms that cause an intrinsic semiconductor to be of the second conductivity type.

The semiconductor storage device in the present invention may be operated in such a way that the quantity of current flowing from the second conductivity type region to the other second conductivity type region during application of a voltage to the gate electrode is changed.

In one embodiment, the memory function body doubles as a gate insulating film and is provided between the gate electrode and the semiconductor layer in such a way that two opposite lateral portions of the memory function body are respectively positioned on the corresponding second conductivity type regions.

In another embodiment, the memory function body includes a first memory function body and a second memory function body, and the first and the second memory function bodies are provided on both sides of the gate electrode in such a way as to straddle boundaries between the first conductivity type region and each of the second conductivity type regions.

Since formation of the first memory function body and the second memory function body on each side of the gate electrode is normally performed after the etching step for forming the gate electrode, it is an important issue to enhance the film quality of the charge retention insulators contained in these memory function bodies. The present invention renders a very large effect on this issue. More particularly, the increase in read current is suppressed with considerable effectiveness.

The aforementioned impurity atoms may be present in the charge retention insulators. In this case, it becomes possible to easily impart flawless film quality to the charge retention insulators as with the gate insulating film in general logic transistors.

In the case where the impurity atoms are present in the charge retention insulator, the concentration of the impurity atoms should preferably be $10^{15}$-$10^{21}$ cm$^{-3}$. If the concentration is less than $10^{15}$cm$^{-3}$, the effect of decreasing the reduction in read current in the erased state is not sufficient, whereas if the concentration is over $10^{21}$cm$^{-3}$, the film quality of the charge retention insulator is considerably deteriorated and the function of retaining electric charges becomes insufficient.

The impurity atoms may be present at a concentration in a part of the first conductivity type region of the semiconductor layer, which part includes an interface between the semiconductor layer and the charge retention insulator and a region shallower than the preset depth from the interface.

In this case, the effect of suppressing the reduction in read current in the erased state is smaller than that in the case where the impurity atoms are present in the charge retention insulator. However, since the effective impurity concentration in the vicinity of a channel between the second conductivity type regions in the semiconductor storage device is lowered, a threshold value in the erased state of the semiconductor storage device decreases and the read current increases. Thus, the read speed of the semiconductor storage device can increase accordingly. Therefore, as a whole, it becomes possible to increase the read speed to a level equivalent to the speed in the case where the impurity atoms are present in the charge retention insulator.

The concentration of the impurity atoms contained in the first conductivity type region may preferably be $10^{15}$ cm$^{-3}$ or more and less than a concentration of impurities contained in the first conductivity type to impart the first conductivity type thereto.

This impurity concentration can provide a sufficient effect of reducing the read current in the erased state and also provide a sufficient memory effect. Further, the region in the vicinity of the interface is kept to be of the first conductivity type, which allows reduction in off-leakage.

The concentration of the impurity atoms contained in the first conductivity type region mat become lower as a depth from the interface increases.

In this case, the effective impurity concentration in a deep region of the semiconductor layer can be kept sufficiently high while the effective impurity concentration in the channel can be kept sufficiently low. This makes it possible to increase the read current in the erased state of the semiconductor storage device while suppressing the short-channel effect. Therefore, increasing the read speed in the semiconductor storage device, increasing the memory capacity per unit area upon integration, and reducing costs can be achieved easily.

In one embodiment, the first and second conductivity types are respectively a P type and an N type, and the impurity atoms are phosphorus atoms.

The phosphorus atoms can particularly make small a decreasing rate of the read current in the erased state in comparison with other impurity atoms.

As a material of the charge retention insulator, silicon oxide can be used. The silicon oxide film is excellent in charge retention function as it provides a high barrier against electric charges. On the other hand, as a material of the charge storage insulator, silicon nitride can be used. Since the silicon nitride film can store electric charges at a high density (that is, the film has a large storage capacity of electric charges), the memory window is allowed to be increased. Moreover, both the silicon oxide film and the silicon nitride film are widely used in normal LSI process. Therefore, by using at least one of these materials, favorable memory characteristics with high reliability can easily be obtained.

In one embodiment, the semiconductor storage device further includes a first voltage feed section electrically connected to the first conductivity type region; and second and third voltage feed sections electrically connected to the two second conductivity type regions, respectively. And, the first, the second and the third voltage feed sections apply voltages to each of the first conductivity type region and the two second conductivity type regions so that a reverse bias is applied to a junction between the first conductivity type region and the second conductivity type regions for executing an erase operation.

According to this arrangement, band-to-band tunneling takes place in the vicinity of the junctions between the first conductivity type region and the second conductivity type regions, and a rewrite operation is performed by the electric charges generated by the band-to-band tunneling.

When the rewrite operation is performed by the electric charges generated by the band-to-band tunneling, the reduction in read current in the erased state is notable unless no measure is taken. Therefore, the effect of suppressing the reduction in read current in the present invention is particularly significant in the case where the rewrite operation is performed by the electric charges generated by the band-to-band tunneling.

In one embodiment, the semiconductor storage device further includes a fourth voltage feed section electrically connected to the gate electrode, and the semiconductor storage device has a first write mode satisfying V2<V3, and a second write mode satisfying V2>V3, where V2 is a voltage produced by the second voltage feed section and V3 is a voltage produced by the third voltage feed section during a write operation.

The semiconductor storage device has two write modes, and therefore when the memory function body doubles as a gate insulating film, electric charges are stored in different areas of one charge storage insulator, whereas when the first and the second memory function bodies are provided on both sides of the gate electrode, electric charges are stored in the charge storage insulators in the respective memory function bodies. This makes it possible to increase information storable in one semiconductor storage device, increase memory capacity per unit area upon integration of the semiconductor storage devices, and reduce the manufacturing costs.

Furthermore, there is provided, according to a second aspect of the present invention, a manufacturing method for a semiconductor storage device, comprising the steps of:

forming a gate insulating film including a first insulator having a charge retention function and a second insulator having a charge storage function by forming the first insulator on a first conductivity type semiconductor layer and then forming the second insulator;

forming a gate electrode on the gate insulating film;

forming two second conductivity type regions in the semiconductor layer on both sides of the gate electrode;

annealing for activating impurities in the second conductivity type regions; and introducing such impurity atoms as would cause an intrinsic semiconductor to be of the second conductivity type, to between the second insulator and a preset depth location in the first conductivity type semiconductor layer between the two second conductivity type regions, wherein the step of introducing the impurity atoms is performed prior to the step of annealing.

Use of the method achieves the semiconductor storage device including the memory function body that doubles as a gate insulating film according to one embodiment of the present invention.

Further, the step of introducing impurity atoms (e.g., phosphorus atoms) (e.g., an ion implantation step) is executed before the annealing step for activating impurities in the second conductivity type regions. This eliminates the necessity, which would otherwise rise, of additionally executing the annealing processing for the impurity atoms introduced to between the second insulator and the preset depth location in the first conductivity type semiconductor layer between the two second conductivity type regions so as to attain an action of suppressing formation of such defects as would cause carrier (hole) traps. Therefore, it becomes possible to reduce the number of steps:and decrease manufacturing costs in comparison with the case of additionally executing such annealing.

The step of introducing the impurity atoms may be performed after formation of the first insulator and before deposition of a conductor constituting the gate electrode.*

According to this method, the impurity atoms are directly introduced to the first insulator, and in addition, the introducing step such as an ion implantation step is executed before deposition of a conductor constituting the gate electrode, which makes it possible to decrease a half-width in a depth direction of an implantation profile. In other words, impurity atoms can be injected into a narrow range in the depth direction. This makes it possible to introduce a sufficient quantity of impurity atoms to a desired place and prevent the impurity atoms from being introduced to an undesired place. Therefore, side effects such as deterioration of the short-channel effect are prevented.

Executing the step of introducing the impurity atoms after formation of the second insulator would avoid contamination of the first insulator which is important for retention of electric charges. This is because the first insulator is covered with the second insulator during the introducing step. Therefore, the reliability of the semiconductor storage device can be enhanced.

Also, there is provided a manufacturing method for a semiconductor storage device, according to a third aspect of the present invention, that includes the steps of:

forming a gate electrode on a first conductivity type semiconductor layer via a gate insulating film;

forming a first insulator having a charge retention function on the semiconductor layer and on both sides of the gate electrode;

forming a second insulator having a charge storage function on the first insulator;

forming two second conductivity type regions in the semiconductor layer on both sides of the gate electrode;

annealing for activating impurities in the second conductivity type regions; and introducing such impurity atoms as would cause an intrinsic semiconductor to be of the second conductivity type, to between the second insulator on each side of the gate electrode and a preset depth location in the first conductivity type semiconductor layer between the two second conductivity type regions, wherein the step of introducing the impurity atoms is performed prior to the step of annealing.

Use of this method achieves the semiconductor storage device that has the first and second memory function bodies on both sides of the gate electrode according to one embodiment of the present invention. Further, the step of introducing impurity atoms (e.g., phosphorus atoms) (e.g., ion implantation step) is executed before the annealing step for activating impurities in the second conductivity type regions, as in the method according to the second aspect of the present invention. This eliminates the necessity, which would otherwise rise, of additionally executing the annealing processing for the impurity atoms introduced to between the second insulator and the preset depth location in the first conductivity type semiconductor layer between the two second conductivity type regions to attain an action of suppressing formation of defects that cause carrier (hole) traps, as described above.

In one embodiment, the manufacturing method further includes forming a further film on the second insulator, and the step of introducing the impurity atoms is performed after formation of the first insulator and before formation of the further film.

This makes it possible to introduce a sufficient quantity of impurity atoms to a desired place and prevent the impurity atoms from being introduced to an undesired place.

If the step of introducing the impurity atoms is performed after formation of the second insulator, it is possible to avoid contamination of the first insulator during the step of introducing the impurity atoms. Therefore, the reliability of the semiconductor storage device can be enhanced.

A portable electronic equipment according to a fourth aspect of the present invention includes the semiconductor storage device having any one of the structures disclosed above.

The semiconductor storage device of the present invention facilitates a process to integrate a memory section and a logical circuit section, allows easy miniaturization, and allows high-speed read operation. Applying such a semiconductor storage device to the portable electronic equipment allows the reliability and the operation speed of the portable electronic equipment to be enhanced, allows downsizing and achieves reduction in manufacturing costs.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAIINTRODUCED DESCRIPTION OF THE INVENTION

The semiconductor storage device of the present invention has a memory function body that has a charge storage insulator made of an insulator having a function of storing electric charges and a charge retention insulator separating the charge storage insulator and a semiconductor layer from each other. And, the charge retention insulator, an interface between the charge retention insulator and the semiconductor layer, and/or the semiconductor layer in the vicinity of the interface contains impurities which provide a conductivity type opposite to that of the semiconductor. This can considerably alleviate the problem that a threshold value of the semiconductor storage device increases (read current decreases) with a lapse of time after the semiconductor storage device is put in an erased state. The present invention is applicable to any semiconductor storage device having a memory function body that has a charge storage insulator made of an insulator having a function of storing electric charges and a charge retention insulator separating the charge storage insulator and a semiconductor layer from each other, and such a semiconductor storage device is implemented in a lumber of examples in which the position of the memory function body is different. Some of such examples will be disclosed below as embodiments of the present invention.

Embodiment 1

A semiconductor storage device in Embodiment 1 is structured such that a memory function body is disposed between a semiconductor layer and a gate electrode and doubles as a gate insulating film.

Figure 1:
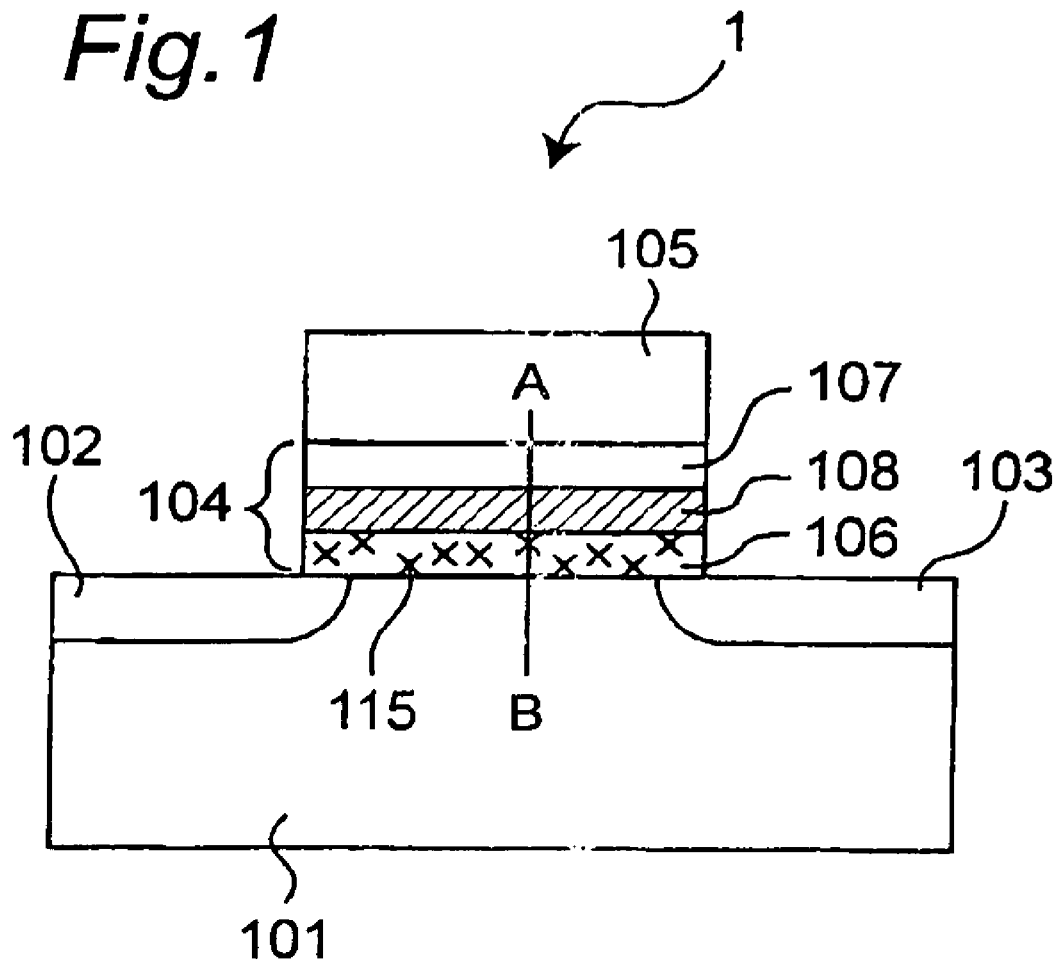
FIG. 1 is schematic cross sectional view showing a semiconductor storage device in Embodiment 1 of the present invention.

More specifically, as shown in FIG. 1, a memory element 1 exemplifying the semiconductor storage device in the present invention is structured such that a surface portion of a P type (first conductivity type) silicon substrate 101 as a semiconductor layer is formed with two N type (second conductivity type) diffusion regions 102, 103 serving as source/drain regions. A gate electrode 105 is formed above a channel region defined between the two diffusion regions 102, 103, with a gate insulating film 104 serving as a memory function body disposed between the gate electrode and the channel region. The gate insulating film 104 has a bottom insulating film 106 serving as a charge retention insulator (first insulator), a top insulating film 107, and a silicon nitride film 108 serving as a charge storage insulator (second insulator) that is disposed between the bottom insulating film 106 and the top insulating film 107. The charge storage insulator (silicon nitride film) 108 has a function to store (i.e., trap) electric charges, and the quantity of electric charges stored in the charge storage insulator 108 constitutes information stored in the memory element 1. The charge retention insulator (bottom insulating film) 106 has a function to prevent the electric charges stored in the charge storage insulator 108 from dissipating toward the substrate 101.

Figure 2:
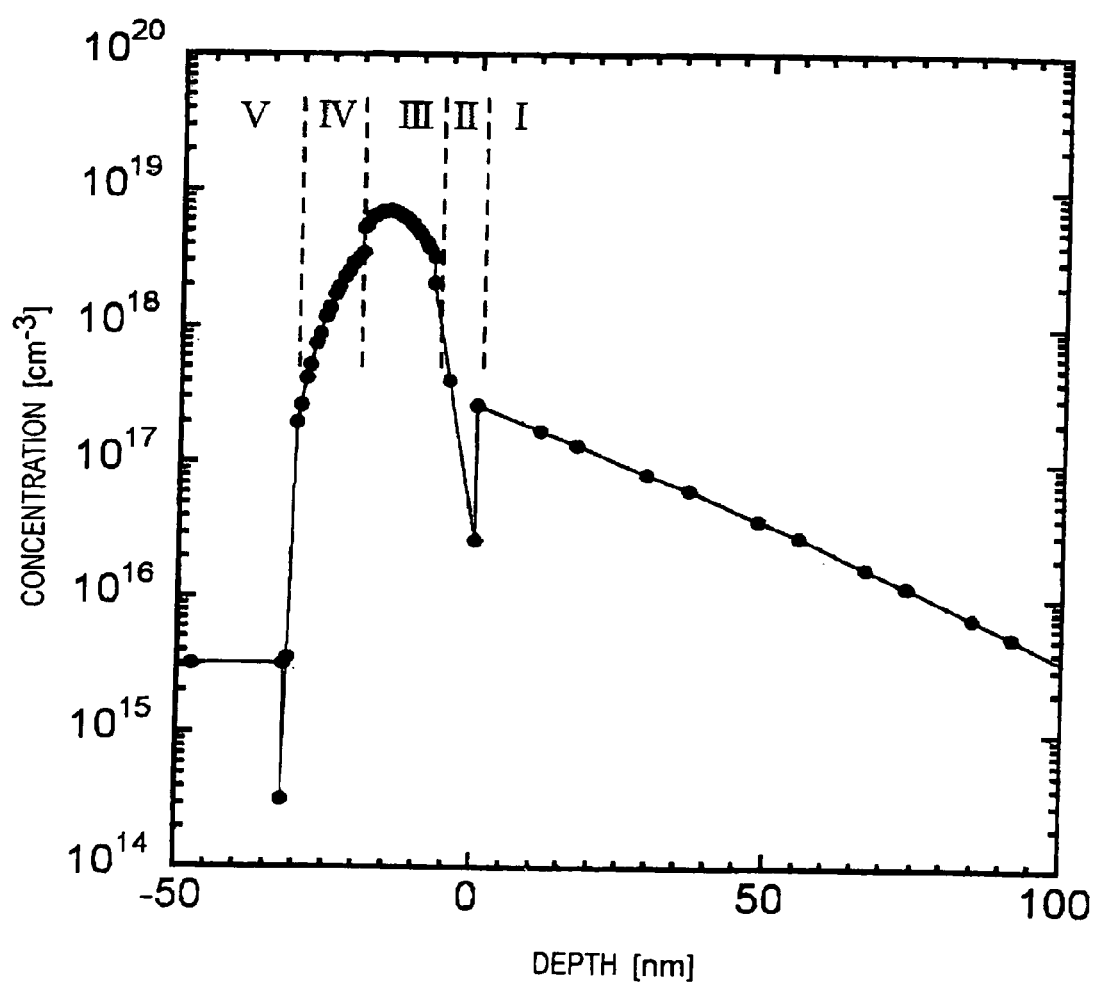
FIG. 2 is a view showing a concentration profile of phosphorus atoms along a line A-B in the semiconductor storage device shown in FIG. 1.

In Embodiment 1, the bottom insulating film 106 serving as a charge retention insulator is made of silicon oxide film and contains phosphorus (P) atoms 115, which would cause an intrinsic semiconductor to be of an N type (second conductivity type). FIG. 2 shows a concentration profile of phosphorus atoms, attained by process simulation, along a cutting-plane line A-B shown in FIG. 1. In FIG. 2, a region I denotes the substrate 101, a region II denotes the bottom insulating film 106, a region III denotes the silicon nitride film 108, a region IV denotes the top insulating film 107, and a region V denotes the gate electrode 105. As is apparent from FIG. 2, the bottom insulating film 106 (region II in FIG. 2) contains phosphorus atoms at the concentration of about $10^{16}$-$10^{18}$ cm$^{-3}$.

A method for doping the bottom insulating film serving as the charge retention insulator with phosphorus will be described later in connection with a later-described embodiment.

Figure 3:
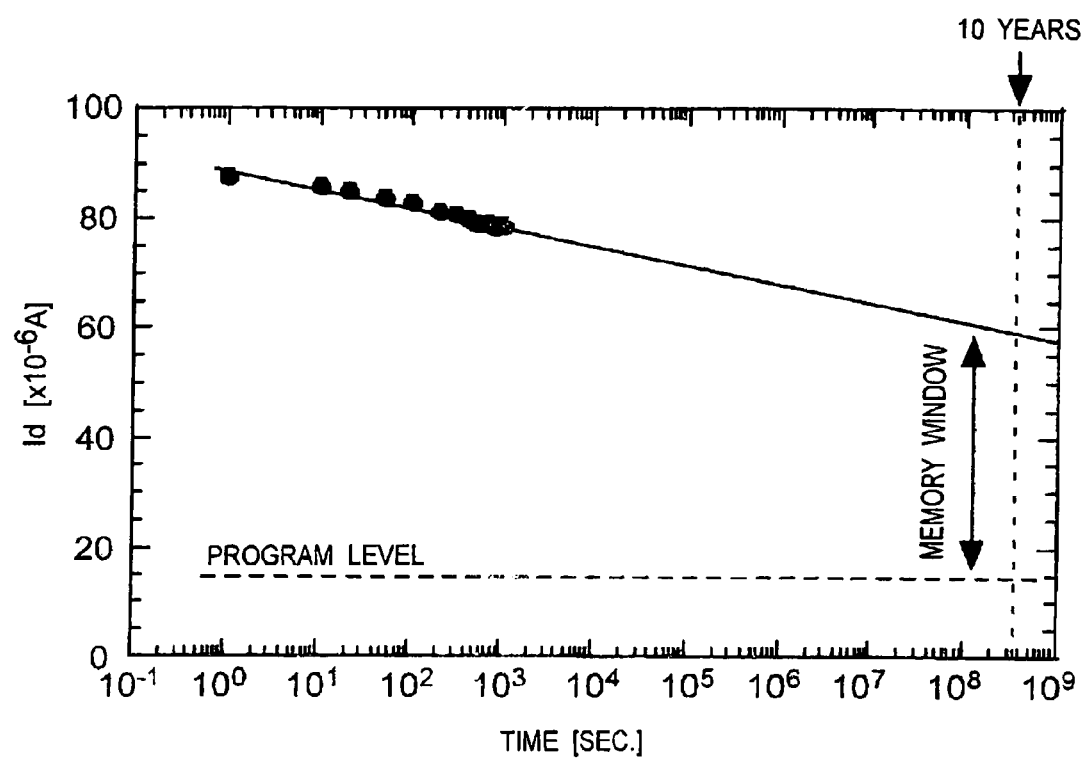
FIG. 3 is a graph showing time change of read current in an erased state in the case where a charge retention insulator does not contain phosphorus.
Figure 4:
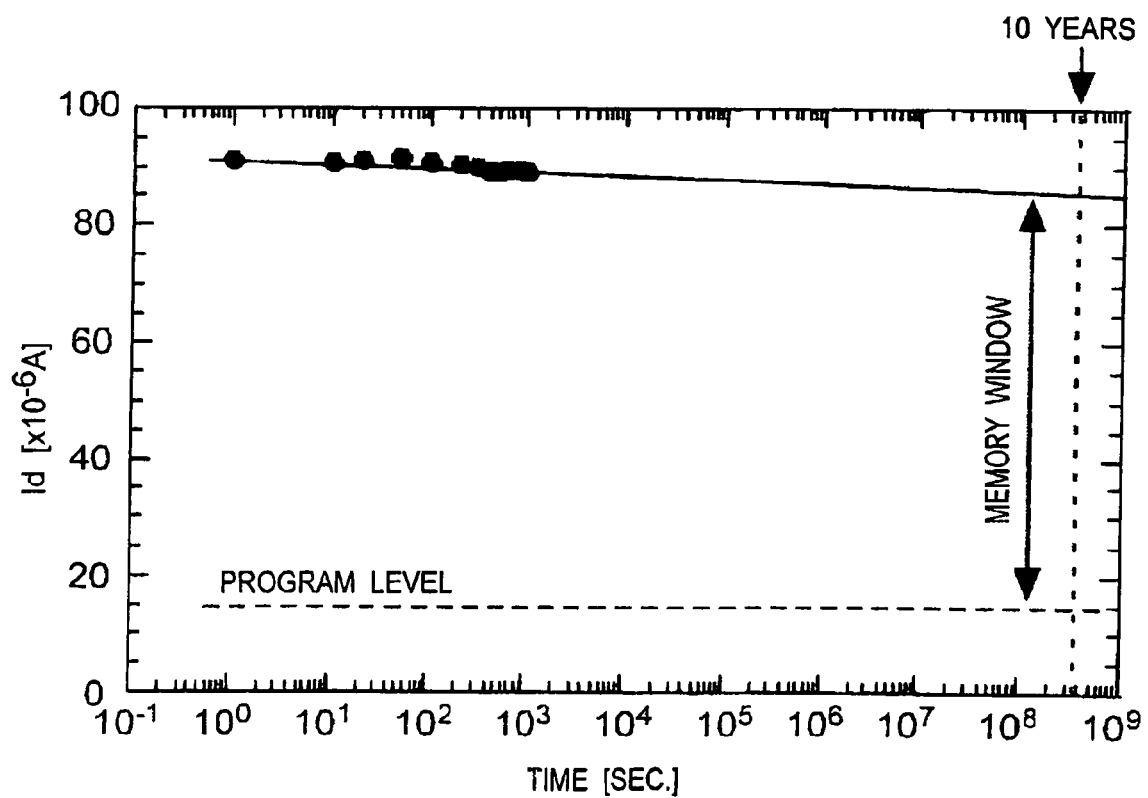
FIG. 4 is a graph showing time change of read current in an erased state in the case where a charge retention insulator contains phosphorus.

FIG. 3 and FIG. 4 show time changes of read current in an erased state in the case where phosphorus is contained in the bottom insulating film 106 serving as the charge retention insulator and in the case where phosphorus is not contained therein, respectively. As is clear from the comparison between FIG. 3 and FIG. 4, reduction in read current is considerably smaller in the case where phosphorus is contained in the bottom insulating film 106 serving as a charge retention insulator (FIG. 4) than in the case where phosphorus is not contained therein (FIG. 3). Therefore, a memory window after a lapse of 10 years is about 70 μA in the case of containing phosphorus, which is considerably larger than the memory window of about 42 μA in the case of containing no phosphorus. There is a theory that holes trapped in defects of a bottom insulating film play an important role in the reduction of read current in the erased state. From this, it is considered that formation of a defect which causes hole trap is suppressed by the phosphorus being contained in the bottom insulating film 106.

As is apparent from the above, the semiconductor storage device in Embodiment 1 can enlarge the memory window even after retaining information for a long period of time, which allows the increase in read speed. Further, a desired memory window can be secured even with a decreased device size, making it possible to miniaturize memory elements.

While phosphorus atoms that are V group elements were introduced as impurities for providing the N type conductivity to a semiconductor (silicon in this example) into the bottom insulating film 106 serving as a charge retention insulator in Embodiment 1, it was also confirmed that reduction in read current in the erased state was suppressed by arsenic (As) atoms. However, the reduction rate of read current in the erased state was very small particularly in the case of introducing phosphorus atoms, compared to the case of introducing arsenic atoms. Therefore, introducing phosphorus atoms is much more preferable. The impurities which produce an N type conductivity may be other V-group elements such as antimony (Sb).

It is to be noted that the effect of suppressing the reduction in read current in the erased state attained by the phosphorus contained in the bottom insulating film 106 serving as a charge retention insulator is more notable when the erase operation is effected by injecting holes generated by band-to-band tunneling into the charge storage insulator (silicon nitride film) 108. More particularly, the effect becomes notable when a reverse voltage is applied to a PN junction formed in a boundary between the diffusion region 102 or 103 and the semiconductor layer (silicon substrate) 101 to generate band-to-band tunneling and generated holes are injected into the charge storage insulator 108 so as to execute a rewrite operation. This is because the holes generated by the band-to-band tunneling have a high probability of forming hole traps in the bottom insulating film 106, which would make the reduction in read current in the erased state noticeable without any measure for it, thereby accentuating remarkable remediation of the problem about the reduction in read current achieved by the phosphorus contained in the bottom insulating film.

Employing the erase method using the band-to-band tunneling makes it possible to store electric charges independently in two areas of the memory function body 104 in the vicinity of the diffusion regions 102 and 103, respectively, by which 2-bit or more information can be stored.

Description is now briefly given of a 2-bit operation. In the write operation, 0V is applied to one diffusion region (hereinbelow referred to as a "first diffusion region") 102, a positive voltage (e.g., 7V) is applied to the other diffusion region (hereinbelow referred to as a "second diffusion region") 103, and a positive voltage (e.g., 3V) is applied to the gate electrode 105, so that the memory element is turned on and electrons flow from the first diffusion region 102 to the second diffusion region 103. At this point, hot electrons are generated in the vicinity of the second diffusion region 103, and the electrons are locally stored in a location near the second diffusion region 103 in the silicon nitride film 108. In this way, write access is made to a portion of the silicon nitride film 108 on the side of the second diffusion region 103 (referred to as a "second storage section"). In the case where write access is made to a portion on the side of the first diffusion region 102 (hereinbelow referred to as a "first storage section"), the voltages of the first diffusion region 102 and the second diffusion region 103 should be interchanged.

For the read operation, the magnitude of voltages of the first and second diffusion regions 102, 103 for the write operation should be interchanged. For example, for reading information in the second storage section, 0V is applied to the second diffusion region 103, a positive voltage (e.g., 1V) is applied to the first diffusion region 102, and a positive voltage (e.g., 3V) is applied to the gate electrode 105. For reading information in the first storage section, 0V is applied to the first diffusion region 102, a positive voltage (e.g., 1V) is applied to the second diffusion region 103, and a positive voltage (e.g., 3V) is applied to the gate electrode 105. Thus, information stored in desired storage sections can be read out.

For the erase operation, 0V should be applied to the silicon substrate 101, a positive voltage (e.g., 5V) is applied to the first and second diffusion regions 102, 103, and a negative voltage (e.g., −5V) should be applied to the gate electrode 105. When such voltages are applied, holes due to the band-to-band tunneling are generated in the respective vicinities of the first and second diffusion regions 102, 103 and injected into the silicon nitride film 108. The positions of the holes injected at this point are almost equal to the injection positions of electrons during the write operation. This makes it possible to erase the first and second storage sections at the same time. Although a positive voltage is applied to both the first and the second diffusion regions in this example, the first or the second storage section can selectively be erased when a positive voltage is applied to either the first or the second diffusion region.

By the method disclosed above, it is possible to trap electric charges in the two locations near the two diffusion regions 102, 103 of the memory function body 104, independently, and thereby store 2-bit information. For storing information beyond 2 bits, the storage level in each storage section should be ternary or more. For example, in the case where the storage level of each storage section is quaternary, totally hexadecimal, or 16-valued, (4 bits) information can be stored in the entire memory cell.

Thus, when electric charges are stored in the memory function body 104 independently in the respective vicinities of the two diffusion regions 102, 103 and 2-bit information is thus stored, information storable in one memory element increases, which makes it possible to increase memory capacity per unit area when memory elements are integrated and makes it possible to reduce costs accordingly.

In the semiconductor storage device in Embodiment 1, the gate insulating film 104 serving as a memory function body is interposed between the silicon substrate 101 that is a semiconductor layer and the gate electrode 105. In the case of setting the memory function body 104 in this manner, the bottom insulating film 106 serving as a charge retention insulator can easily gain a film quality of less defects equivalent to the gate insulating film in normal logic transistors. Therefore, the reduction in read current in the erased state can be maintained relatively small.

The concentration of phosphorus atoms contained in the bottom insulating film 106 serving as a charge retention insulator should preferably be $10^{15}$-$10^{21}$ cm$^{-3}$. When the concentration of phosphorus atoms is $10^{15}$ cm$^{-3}$ and the thickness of the bottom insulating film is 10 nm, the area density of phosphorus atoms in the bottom insulating film 106 is $10^9$ cm$^{-2}$. At the concentration less than this, the effect to decrease the reduction in read current in the erased state is not sufficient. When the concentration of phosphorus atoms is over $10^{21}$ cm$^{-3}$, the film quality of the bottom insulating film is considerably deteriorated and its function of retaining electric charges becomes insufficient. This is why the concentration of phosphorus atoms contained in the bottom insulating film 106 serving as a charge retention insulator should preferably be $10^{15}$-$10^{21}$ cm$^{-3}$.

Although the silicon nitride film is used as the charge storage insulator 108 in Embodiment 1, the material of the charge storage insulator 108 is not limited thereto and other materials such as aluminum oxides, hafnium oxides, zirconium oxides, tantalum oxides, zinc oxides and silicon carbides may also be used. Moreover, although the silicon oxide films are used as the charge retention insulator (bottom insulating film) 106 and the top insulating film 107 in Embodiment 1, the material thereof is not limited thereto. However, it is preferable to use a silicon nitride film as the charge storage insulator and a silicon oxide film (including a silicon oxynitride) as the charge retention insulator. Since the silicon nitride film has a high density of storable electric charges, the memory window can be increased. The silicon oxide film is excellent in charge retention function as it provides a high barrier against electric charges. Further, the silicon nitride film and the silicon oxide film are widely used in normal LSI process. Therefore, favorable memory characteristics with high reliability can easily be obtained.

Although in Embodiment 1, description has been made of the memory element 1 in which the N type is the first conductivity type and the P type is the second conductivity type, the first conductivity type may be the P type and the second conductivity type may be the N type. In such a case, examples of the impurity atoms that provide the P type conductivity to the semiconductor include boron (B), aluminum (Al) and gallium (Ga).

Embodiment 2

Figure 5:
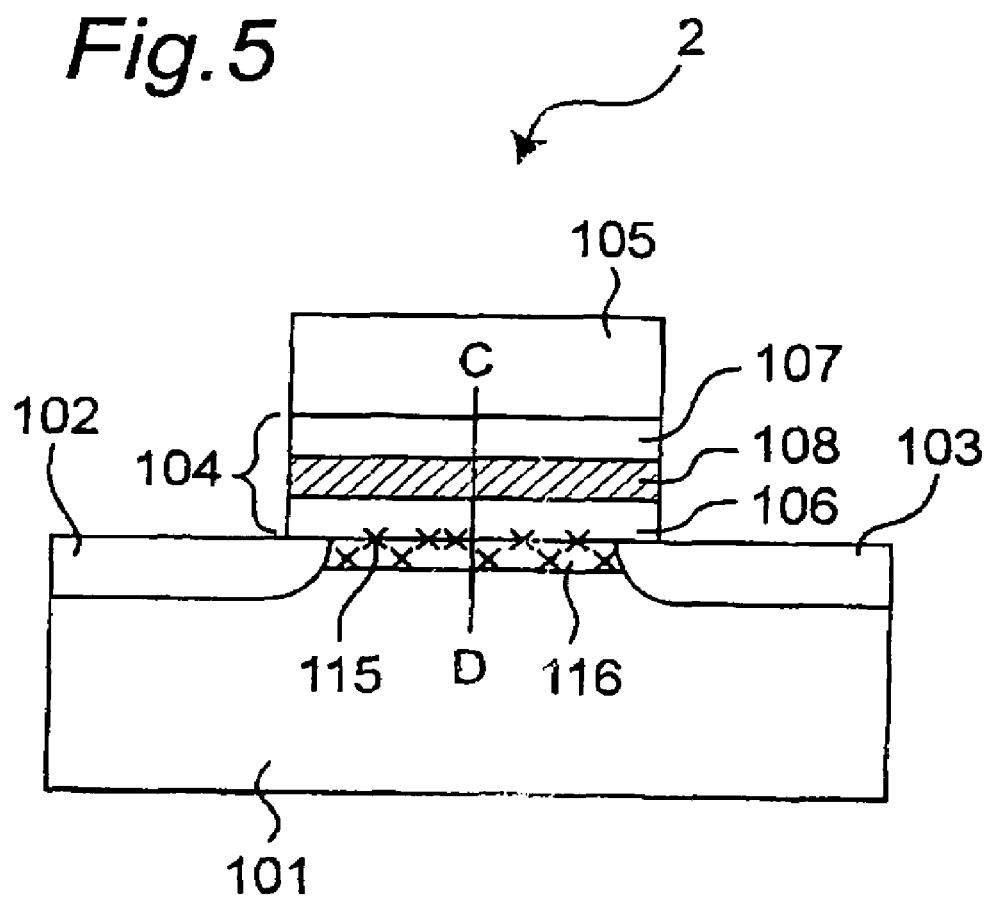
FIG. 5 is schematic cross sectional view showing a semiconductor storage device in Embodiment 2 of the present invention.

A semiconductor storage device in Embodiment 2 is identical in structure to the semiconductor storage device in Embodiment 1 in the point that a memory function body is interposed between a semiconductor layer and a gate electrode and doubles as a gate insulating film, while the semiconductor storage device in Embodiment 2 is different from Embodiment 1 in the location of presence of the impurity atoms with which an intrinsic semiconductor would become a second conductivity type semiconductor. In FIG. 5 explaining the semiconductor storage device of the present embodiment, constituent parts identical to those of the semiconductor storage device (FIG. 1) in Embodiment 1 are denoted by identical reference numerals and detailed description thereof will be omitted.

As shown in FIG. 5, in a memory element 2 in Embodiment 2, an interface between a bottom insulating film 106 serving as a charge retention insulator (first insulator) and a semiconductor layer (which is a silicon substrate) 101 as well as the semiconductor layer 101 in the vicinity of the interface has a region 116 containing phosphorus atoms, which is an impurity that converts an intrinsic semiconductor (silicon) to an N type (second conductivity type) semiconductor. In other words, the phosphorus atoms are present in a part of the first conductivity type (i.e., P type here) region in the semiconductor layer which is shallower than a preset depth from the interface between the charge retention insulator (bottom insulating film) 106 and the semiconductor layer 101. Here, it is appropriate to define the preset depth as 10 nm. In such a case, the phosphorus atoms 115 are present even in the interface between the bottom insulating film 106 and the silicon substrate 101.

Figure 6:
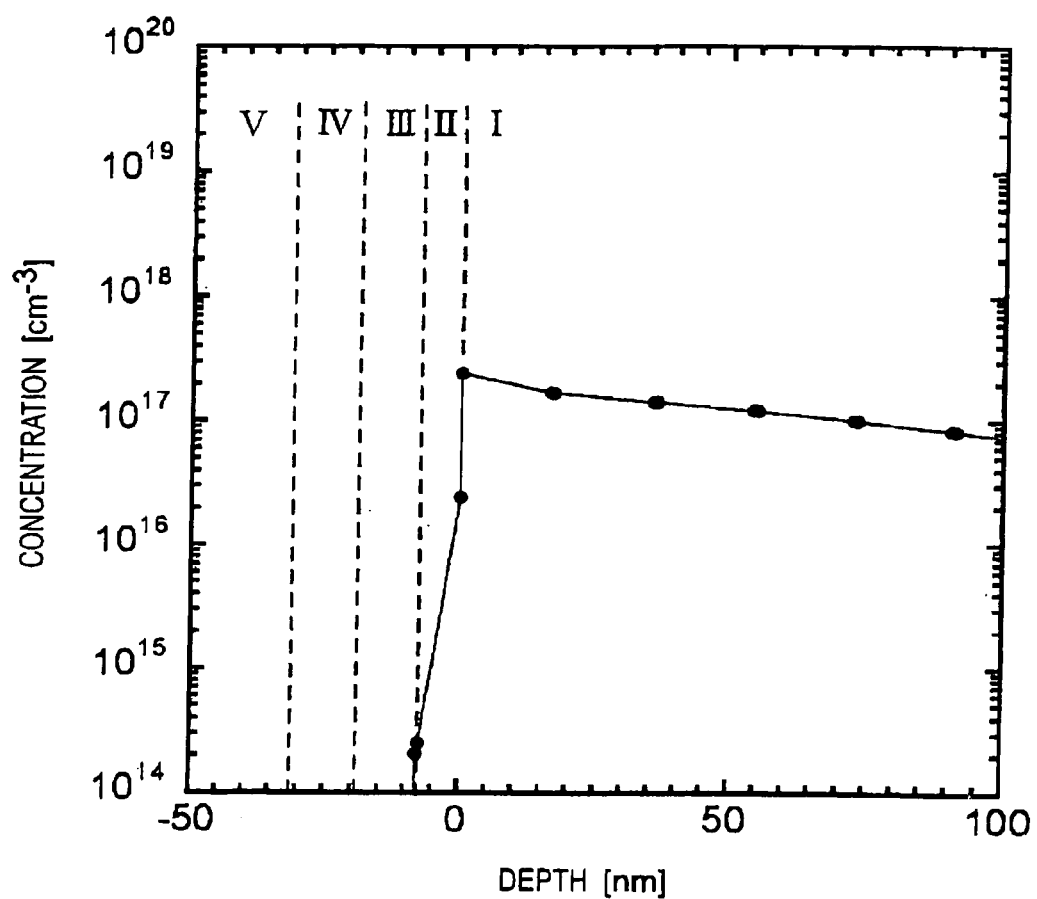
FIG. 6 is a view showing a concentration profile of phosphorus atoms along a line C-D in the semiconductor storage device shown in FIG. 5.

FIG. 6 shows a concentration profile of phosphorus atoms, attained by process simulation, along a line C-D shown in FIG. 5. As with FIG. 2, a region I denotes the substrate 101, a region II denotes the bottom insulating film 106, a region III denotes a silicon nitride film 108, a region IV denotes a top insulating film 107, and a region V denotes a gate electrode 105. As is clear from FIG. 6, phosphorus atoms are present at the concentration of about $10^{17}$ cm$^{-3}$ in an interface between the bottom insulating film 106 (region II in FIG. 6) and the silicon substrate 101 (region I in FIG. 6) as well as in the vicinity of the interface. Unless adverse influence is exerted on the function as a memory element, the phosphorus atoms may exist in a region away by 10 nm or more from the interface between the bottom insulating film 106 and the semiconductor layer as in the case of FIG. 6.

According to the semiconductor storage device in Embodiment 2, formation of defect, which causes a hole trap in the vicinity of the interface between the bottom insulating film 106 and the silicon substrate 101, is suppressed, which in turn suppresses reduction in read current in the erased state. According to an experiment, it was confirmed that the reduction in read current in the erased stated was suppressed though the degree of suppression was not so much as in the case where phosphorus is contained in the entire bottom insulating film 106 as with the semiconductor storage device in Embodiment 1. Therefore, even after stored information has been retained for a long period of time, a memory window can be enlarged, which makes it possible to increase a read speed. Further, even with a smaller device size, a desired memory window can be secured, thereby allowing miniaturization of the memory element.

Moreover, with the region 116 containing phosphorus being formed in the vicinity of the interface, effective impurity concentrations in the vicinity of a channel of the memory element 2 are low. Therefore, the threshold value in an erased state of the memory element 2 decreases and the read current increases, which can increase the read speed of the memory element 2 accordingly.

The concentration of phosphorus contained in the semiconductor layer (silicon substrate in this embodiment) 101 in the vicinity of the interface between the charge retention insulator (bottom insulating film) 106 and the semiconductor layer should preferably become lower toward the silicon substrate side from the interface as shown in FIG. 6. In this case, the effective impurity concentration (i.e., a concentration of impurities which would provide a P type to silicon) in the silicon substrate-side region deeper than the channel can be kept sufficiently high while the effective impurity concentration in the channel can be kept sufficiently low. This makes it possible to increase the read current in the erased state of the memory element 2 as well as suppressing the short-channel effect. Therefore, increasing the read speed in the semiconductor storage device, increasing the memory capacity per unit area upon integration, and reducing costs can be achieved easily. Further, since the concentration in the region slightly deeper than the interface in the silicon substrate 101 is sufficiently high, a potential gradient in a PN junction between the silicon substrate 101 and the diffusion regions 102, 103 is steep during rewrite operation, thereby allowing increase in rewrite speed.

The concentration of phosphorus atoms contained in the interface between the charge retention insulator (bottom insulating film) 106 and the semiconductor layer (silicon substrate) 101 as well as in the semiconductor layer (silicon substrate) 101 in the vicinity of the interface should preferably be $10^{15}$-$10^{20}$ cm$^{-3}$. If the concentration of the phosphorus atoms is less than $10^{15}$ cm$^{-3}$, the effect of decreasing the reduction in read current in the erased state is not sufficient, whereas if the concentration is over $10^{21}$ cm$^{-3}$, it becomes difficult to turn off the memory element and an essential function as the memory element cannot be fulfilled. Therefore, the concentration of the phosphorus atoms contained in the semiconductor layer in the vicinity of the interface between the charge retention insulator and the semiconductor layer should preferably be $10^{15}$-$10^{20}$ cm$^{-3}$.

Further, the concentration of the phosphorus atoms should preferably be lower than the concentration of impurities contained in the P type (first conductivity type) silicon substrate 101 to provide the first conductivity type. More specifically, if, for example, the concentration of boron atoms in the region 116 in the silicon substrate 101 is $10^{18}$ cm$^{-3}$, the concentration of phosphorus atoms should preferably be $10^{15}$-$10^{18}$ cm$^{-3}$. In such a case, the region 106 can be kept to be of the P type (first conductivity type), which allows reduction in off-leakage.

Although in the memory element 2, phosphorus is hardly contained in the charge retention insulator (bottom insulating film) 106, it is naturally preferable that the phosphorus be contained in the bottom insulating film 106. In such a case, the effect of suppressing the reduction in read current in the erased state is further increased.

Embodiment 3

This embodiment relates to a manufacturing method for the semiconductor storage devices as described in connection with Embodiments 1 and 2.

Figure 7A:
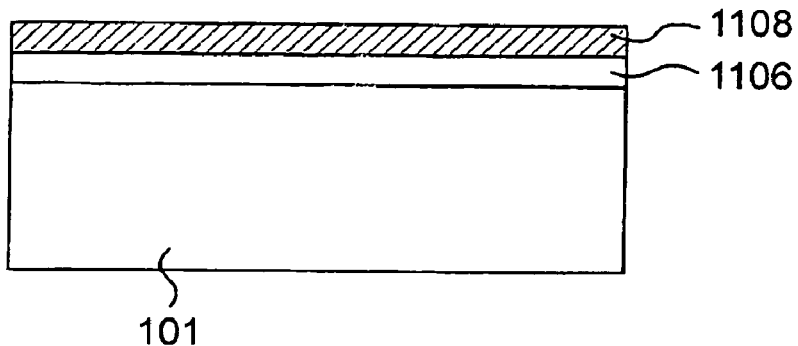
FIGS. 7A, 7B, and 7C are explanatory views showing a fabrication process of a semiconductor storage device in Embodiment 3 of the present invention.
Figure 7B:
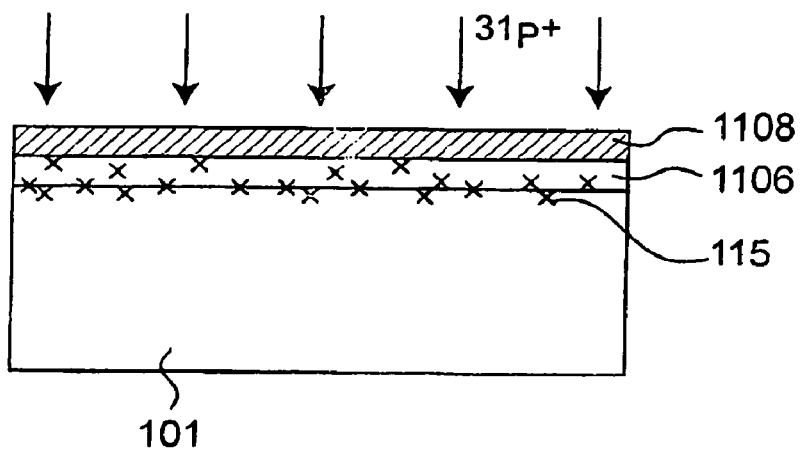
Figure 7C:
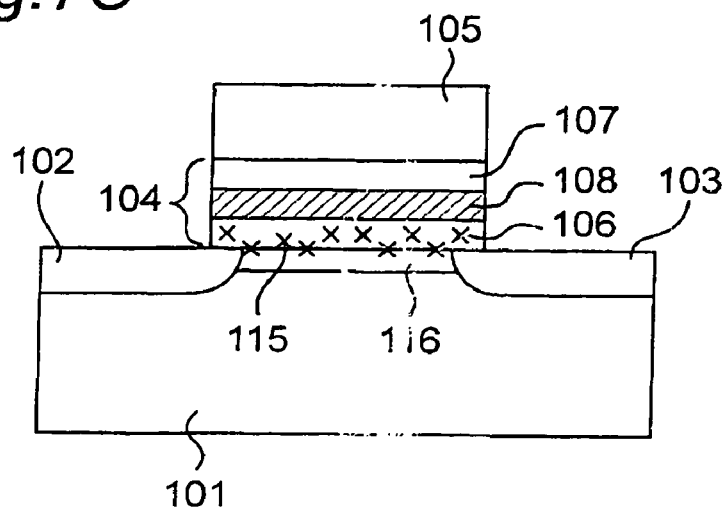

FIGS. 7A to 7C are views schematically showing an example of procedures to manufacture semiconductor storage devices. In these drawings, constituent parts similar to those shown in FIGS. 1 and 5 are denoted by the reference numerals used in FIGS. 1 and 5.

First, as shown in FIG. 7A, a silicon oxide film (first insulator) 1106 to be a bottom insulating film (charge retention insulator) is formed on a P type (first conductivity type) silicon substrate 101 by thermal oxidation. The silicon oxide film 1106 may be formed as a silicon oxynitride film. Moreover, a further oxide film may be laminated on the thermal oxide film by CVD (Chemical Vapor Deposition). The silicon oxide film 1106 should be formed to have a thickness of, for example, 1.5-10 nm. Afterward, a silicon nitride film (second insulator) 1108 to be a charge storage insulator is deposited by CVD. The silicon nitride film 1108 should be formed to have a thickness of, for example, 3-15 nm.

Next, as shown in FIG. 7B, $^{31}$P$^+$ ions are implanted through a laminated film consisting of the silicon oxide film 1106 and the silicon nitride film 1108 by ion implantation method. Implantation energy in the ion implantation step should preferably be such that an implantation range of the $^{31}$P$^+$ ions is within the silicon oxide film 1106 or in the vicinity of an interface between the silicon oxide film 1106 and the silicon substrate 101. Therefore, in the implantation step, the implantation energy of the $^{31}$P$^+$ ions should be, for example, 1-20 KeV and the implantation dose should be $10^{11}$-$10^{14}$ cm$^{-2}$.

Next, after a silicon oxide film is further deposited on the silicon nitride film 1108 by CVD, a conductive material that is an electrode material is deposited to form a gate electrode 105 and a gate insulating film 104 by a known method, and diffusion regions 102, 103 are formed by a known method. It is considered that upon being subjected to activation annealing during the process of formation of the diffusion regions 102, 103, the phosphorus atoms 115 present in the bottom insulating film 106 as well as in the interface between the bottom insulating film 106 and the silicon substrate 101 are made to operate to suppress formation of a defect which would cause a hole trap. Part of phosphorus injected in the ion implantation step is also present in the silicon substrate 101 and is activated by the activation annealing, by which the region 116 containing phosphorus is formed.

This is an example of the procedures for manufacturing the semiconductor storage devices as in Embodiments 1 and 2.

According to the manufacturing method described here, the implantation step of implanting the $^{31}$P$^+$ ions is executed before the activation annealing for forming the diffusion regions 102, 103, and therefore the activation annealing step also functions as an annealing step for the implanted phosphorus to attain an action to suppress formation of a defect which causes a hole trap. This makes it possible to decrease the number of manufacturing process steps and manufacturing costs, accordingly.

Moreover, in this manufacturing method, the implantation step of implanting the $^{31}$P$^+$ ions is executed after the silicon oxide film 1106 to be a charge retention insulator is formed, more precisely, after the silicon nitride film 1108 to be a charge storage insulator is formed. Therefore, phosphorus can directly be injected into the charge retention insulator, which makes it possible to sufficiently increase the concentration of phosphorus in the charge retention insulator and to effectively suppress the reduction in read current in the erased state of the memory element. In addition, since the silicon oxide film 1106 important for retention of electric charges is covered with the silicon nitride film 1108 in the implantation step, contamination of the silicon oxide film (charge retention insulator) 1106 can be avoided. Therefore, using the manufacturing method allows the increase in read speed of the semiconductor storage device and the enhancement of reliability thereof.

Furthermore, the implantation step of implanting the $^{31}$P$^+$ ions is executed before a conductor (with a thickness of, e.g., 50-300 nm) constituting the gate electrode 105 is deposited, which makes it possible to decrease the half-width of the implantation profile in the depth direction. More particularly, phosphorus can be injected in a narrow range in the depth direction. This achieves injection of a sufficient quantity of phosphorus in a desired place and prevents the phosphorus from being injected into an undesired place (e.g., a depth region in the silicon substrate 101). Therefore, side effects such as deterioration of the short-channel effect can be prevented.

It is to be noted that the step of implanting the $^{31}$P$^+$ ions is not limited to the timing employed in this embodiment. What is important is that phosphorus should be introduced such that the phosphorus is present at least in the bottom insulating film 106 or in the interface between the bottom insulating film 106 and the silicon substrate 101.

Without being limited to the ion implantation method, introduction of phosphorus to the bottom insulating film 106 or to the interface between the bottom insulating film 106 and the silicon substrate 101 may be achieved by plasma doping method and solid phase diffusion method.

Fourth Embodiment

A semiconductor storage device in Embodiment 4 has two memory function bodies set on both sides of a gate electrode. As for the location of the impurity atoms which would cause intrinsic semiconductors to be of the second conductivity type, Embodiment 4 conforms to Embodiment 1. It should be understood, therefore, that what has been described in connection with Embodiment 1 shall apply to Embodiment 4 without particular description here.

Figure 8:
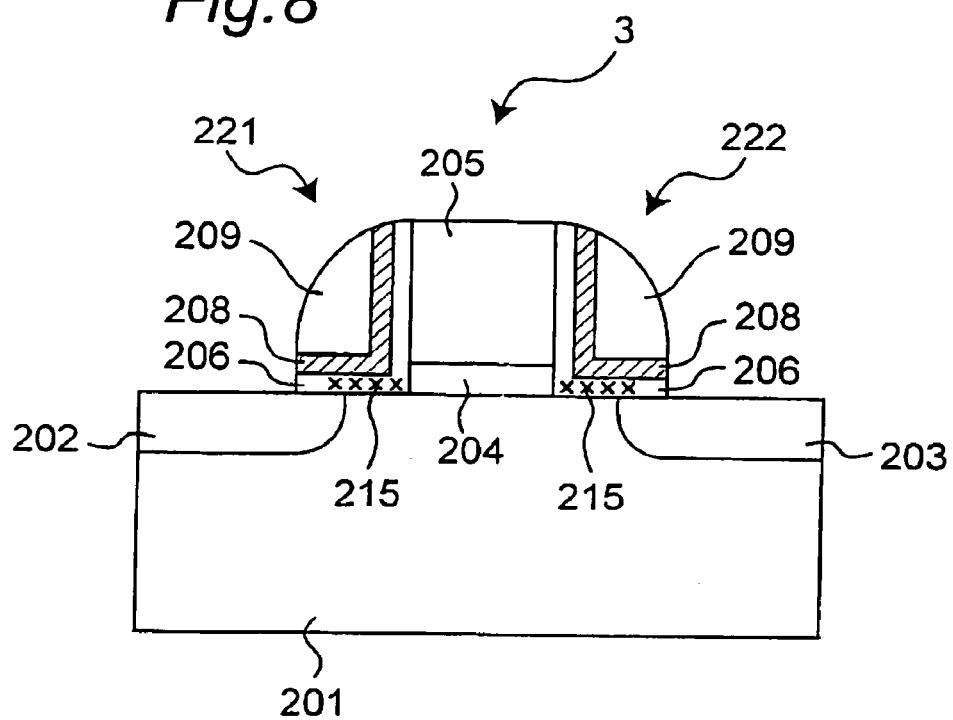
FIG. 8 is schematic cross sectional view showing a semiconductor storage device in Embodiment 4 of the present invention.

More specifically, as shown in FIG. 8, in a memory element 3 that is the semiconductor storage device in this embodiment, two N type (second conductivity type) diffusion regions 202, 203 serving as source/drain regions are formed in a surface portion of a P type (first conductivity type) silicon substrate 201 as a semiconductor layer. A gate electrode 205 is formed above a channel region defined between the two diffusion regions 202, 203 with a gate insulating film 204 disposed between the gate electrode and the channel region. On each side of the gate electrode 205, first and second memory function bodies 221, 222 are formed. The memory function bodies 221, 222 are each structured such that a cross-sectionally L-shaped silicon nitride film 208 serving as a charge storage insulator (second insulator) is interposed between a cross-sectionally L-shaped bottom insulating film 206 serving as a charge retention insulator (first insulator) and a top insulating film 209. The charge storage insulator (silicon nitride film) 208 has a function to store (i.e., trap) electric charges, and the quantity of electric charges stored in the charge storage insulator 208 constitutes information stored in the memory element 3. The charge retention insulator (bottom insulating film) 206 has a function to prevent the electric charges stored in the charge storage insulator 208 from dissipating toward the substrate 201.

In Embodiment 4, the bottom insulating film 206 serving as a charge retention insulator is made of silicon oxide film and contains phosphorus (P) atoms 215 as an impurity that causes intrinsic semiconductors to be of an N type (second conductivity type). Therefore, as with the case of Embodiment 1, the reduction in read current in the erased state with a lapse of time is suppressed.

However, in the semiconductor storage device in this embodiment, the effect of suppressing the reduction in read current in the erased state becomes particularly effective. This is because in the semiconductor storage device in this embodiment, the bottom insulating film 206 is formed on a lateral wall, or sidewall, of the gate electrode 205. In this case, normally, the bottom insulating film 206 is formed after the etching step for forming the gate electrode (which step tends to cause generation of a crystal defect and introduction of impurities), and therefore it is a serious issue to enhance the film quality of the bottom insulating film 206. The phosphorus atoms contained in the bottom insulating film 206 serving as a charge retention insulator brings about a particularly large effect on this issue.

Further, since the memory function bodies 221, 222 are set on the lateral walls of the gate electrode, the gate insulating film 204 can be made thinner. This makes it possible to effectively suppress the short-channel effect. Further, since the two memory function bodies 221, 222 for storing electric charges are separated by the gate electrode 205, interference between the memory function bodies 221, 222 is suppressed. This makes it easy to miniaturize the memory element 3. Therefore, the increase in memory capacity per unit area upon integration and the cost reduction can be achieved. Moreover, since the memory function bodies 221, 222 can easily be formed by a process almost identical to the normal process of forming a gate sidewall insulating film of normal transistors, increase in manufacturing costs of LSIs which compositely incorporate memories and logic circuits can be avoided.

As with the case of Embodiment 1, employing the erase method using the band-to-band tunneling makes it possible to store electric charges independently in the respective charge storage insulators 208 in the two memory function bodies 221, 222, by which 2-bit or more information can be stored.

Moreover, as with Embodiment 1, the concentration of phosphorus atoms contained in the bottom insulating film 206 serving as a charge retention insulator should preferably be $10^{15}$-$10^{21}$ cm$^{-3}$. The reason thereof is as described in Embodiment 1.

It is to be noted that various changes and modifications stated in Embodiment 1 are applicable to Embodiment 4 in the same manner.

Description is now given of an operating method for the semiconductor storage device in Embodiment 4. It is to be noted that the same operating method may apply to later-described semiconductor storage devices in Embodiments 5 and 6.

The principle of write operation of the memory element will be described with reference to FIG. 15 and FIG. 16. The term of "write" or "program" means the injection of electrons into the first and second memory function bodies 221 and 222 when the memory element is of the N-channel type. The following description will be provided on the assumption that the memory element is of the N-channel type.

Figure 15:
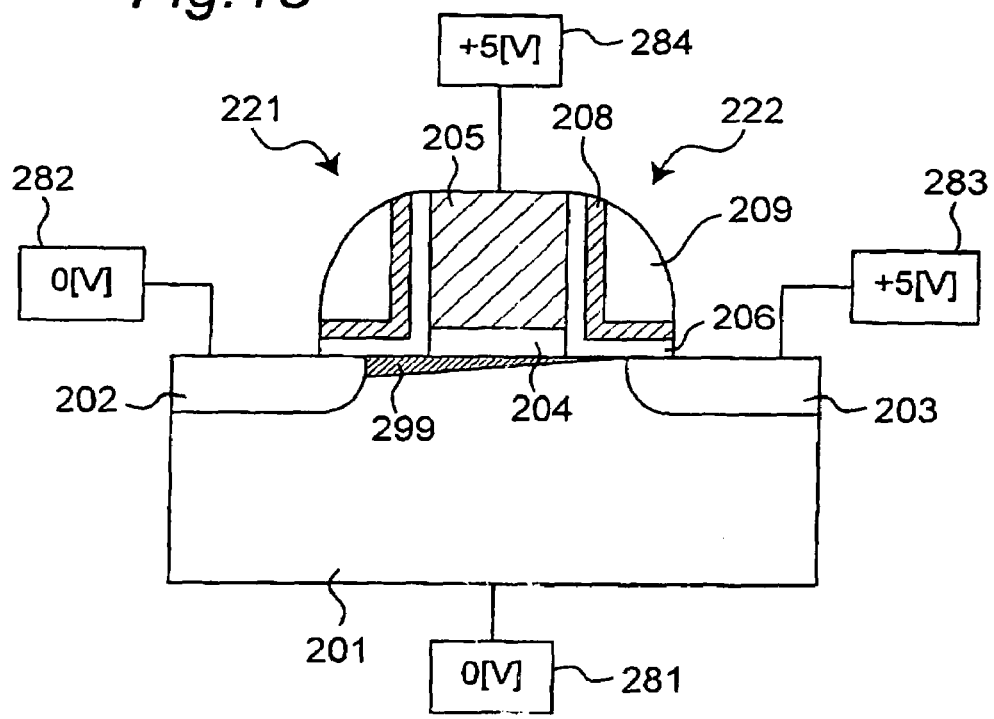
FIG. 15 is an explanatory view showing a write method for the semiconductor storage device in Embodiment 4.

In order to inject electrons (execute write) into the second memory function body 222, as shown in FIG. 15, an N-type diffusion region ("first diffusion region") 202 and the other N-type diffusion region ("second diffusion region") 203 are made to serve as a source electrode and a drain electrode, respectively. For example, a voltage of 0 V is applied to the silicon substrate 201 by a first voltage supply section 281, a voltage of 0 V is applied to the first diffusion region 202 by a second voltage supply section 282, a voltage of +5 V is applied to the second diffusion region 203 by a third voltage supply section 283, and a voltage of +5 V is applied to the gate electrode 205 by a fourth voltage supply section 284. According to the above-mentioned voltage conditions, an inversion layer 299 extends from the first diffusion region 202 (source electrode), but it does not reach the second diffusion region 203 (drain electrode), generating a pinch-off point. Electrons are accelerated from the pinch-off point to the second diffusion region 203 (drain electrode) by a high electrical field and becomes so-called hot electrons (high energy conduction electrons). Write is executed by the injection of these hot electrons into the second memory function body 222. Since no hot electron is generated in the vicinity of the first memory function body 221, write is not executed. This is the first write mode for rewriting the second memory function body 222.

Figure 16:
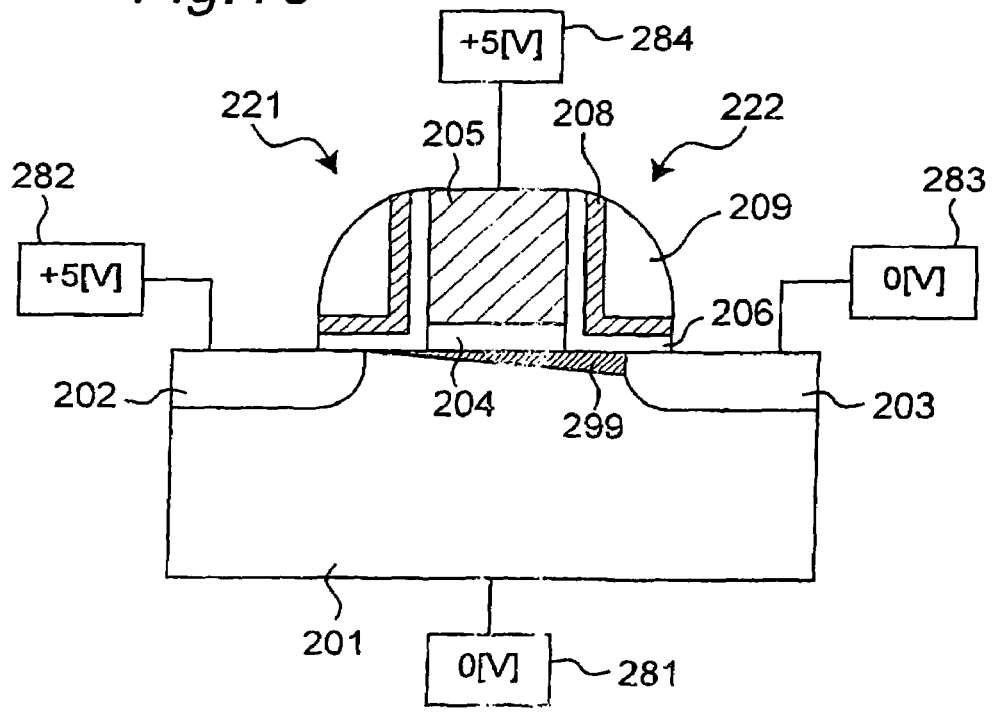
FIG. 16 is an explanatory view showing the write method for the semiconductor storage device in Embodiment 4.

On the other hand, in order to inject an electron (execute write) into the first memory function body 221, as shown in FIG. 16, the second diffusion region 203 and the first diffusion region 202 are made to serve as the source electrode and the drain electrode, respectively. For example, a voltage of 0 V is applied to the silicon substrate 201 by the first voltage supply section 281, a voltage of +5 V is applied to the first diffusion region 202 by the second voltage supply section 282, a voltage of 0 V is applied to the second diffusion region 203 by the third voltage supply section 283, and a voltage of +5 V is applied to the gate electrode 205 by the fourth voltage supply section 284. As described above, by exchanging the source and drain regions reversely to the case where electrons are injected into the second memory function body 222, write can be executed by injecting electrons into the first memory function body 221. This is the second write mode for rewriting the first memory function body 221.

The provision of the first and second write modes allows the two memory function bodies to store electric charge independently of each other to thereby hold two or more-bit information. Therefore, it is possible to increase an amount of information to be stored by a single semiconductor storage device. Accordingly, it is possible to increase a memory capacity per unit area when semiconductor storage devices are integrated, and thus decrease the cost.

Next, the principle of erase operation of the semiconductor storage device will be described with reference to FIG. 17.

Figure 17:
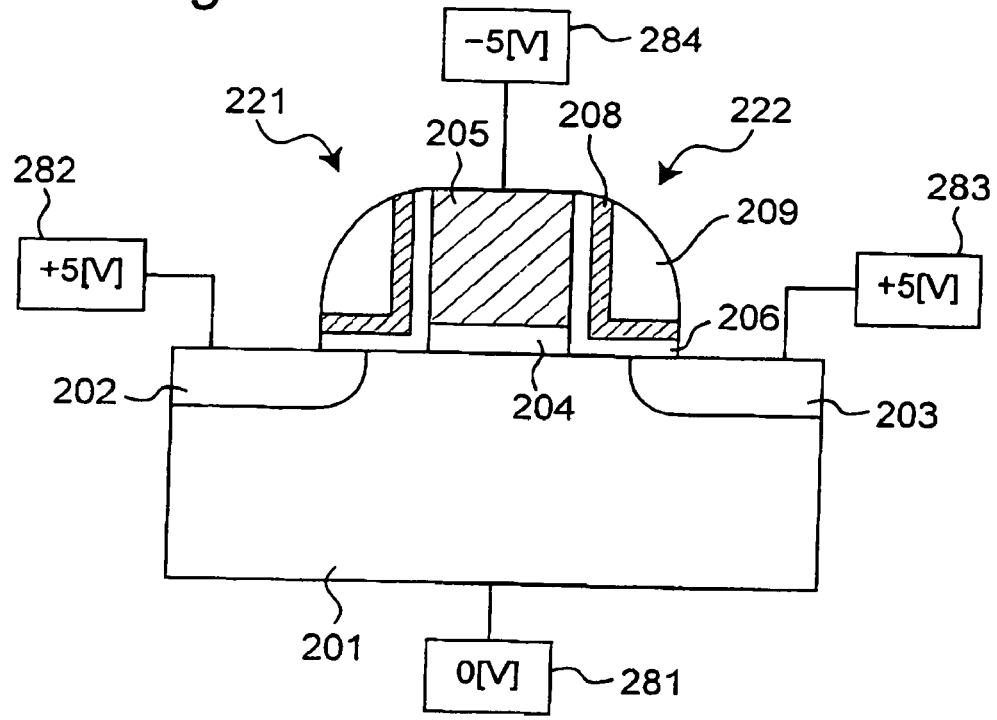
FIG. 17 is an explanatory view showing an erase method for the semiconductor storage device in Embodiment 4.

To erase the information stored in the first and second memory function bodies 221 and 222, as shown in FIG. 17, a positive voltage (e.g., +5 V) is applied to the first and second diffusion regions 202 and 203, a voltage of 0 V is applied to the P-type silicon substrate 201, a reverse bias is applied to a PN junction of the first and second diffusion regions 202 and 203 and the P-type silicon substrate 201, and a negative voltage (e.g., −5 V) is further applied to the gate electrode 205. At this time, the potential slope becomes steep, in particular, in the vicinity of the gate electrode 205 at the PN junction due to the influence of the gate electrode to which the negative voltage is applied. Accordingly, hot holes (high energy holes) are generated on the P-type substrate 201 side of the PN junction due to band-to-band tunneling. These hot holes are drawn toward the gate electrode 205 that have a negative potential, and consequently, the holes are injected into the memory function bodies 221 and 222. The erase of both the first and the second memory function bodies 221 and 222 is executed in this way. A positive voltage is applied to both of the first and second diffusion regions in the above example, but may be one of the first and second diffusion regions, in which case a selective erase of the first or second memory function bodies is performed.

Figure 18:
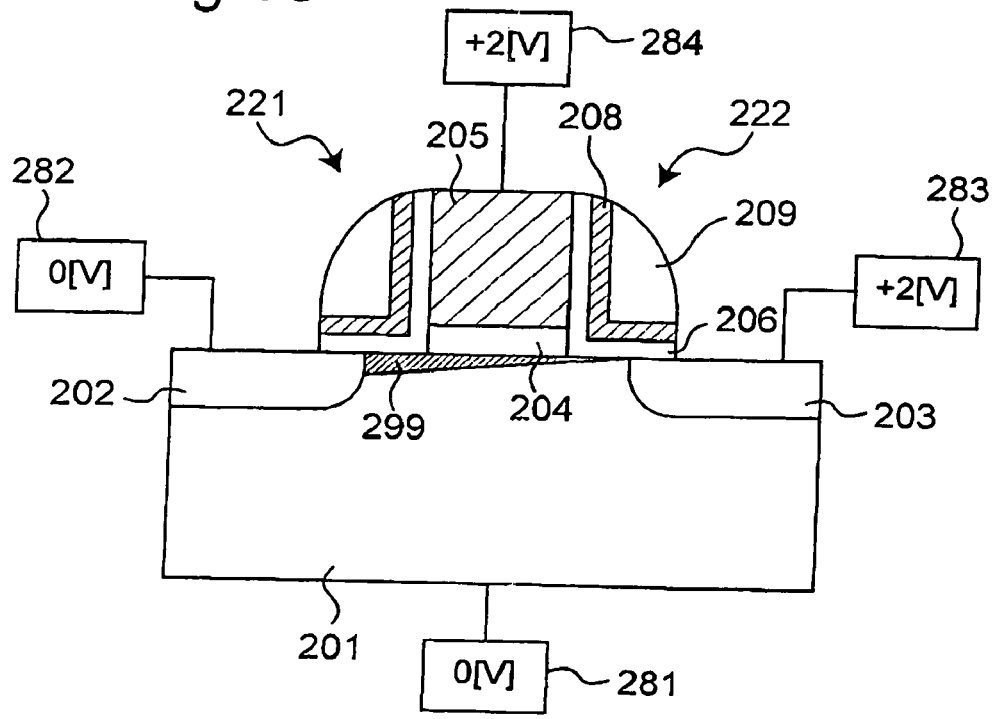
FIG. 18 is an explanatory view showing a read method for the semiconductor storage device in Embodiment 4.

The principle of read operation of the semiconductor storage device will be further described with reference to FIG. 18.

In reading the information stored in the first memory function body 221, the first diffusion region 202 and the second diffusion region 203 are made to function as a source electrode and a drain electrode, respectively. For example, a voltage of 0 V is applied to the first diffusion region 202 and the P-type silicon substrate 201, a voltage of +1.8 V is applied to the second diffusion region 203, and a voltage of +2 V is applied to the gate electrode 205. In this case, when no electron is accumulated in the first memory function body 221, a drain current easily flows. When electrons are accumulated in the first memory function body 221, the inversion layer is not easily formed in the vicinity of the first memory function body 221, and therefore, a drain current hardly flows. Therefore, by detecting the drain current, the storage information of the first memory function body 221 can be read. At this time, due to the occurrence of the pinch-off state in the vicinity of the drain, the presence or absence of charges in the second memory function body 222 renders little influence on the drain current.

In reading the information stored in the second memory function body 222, the device is operated by making the second diffusion region 203 and the first diffusion region 202 function as the source electrode and the drain electrode, respectively. It is proper to apply, for example, a voltage of 0 V to the second diffusion region 203 and the silicon substrate 201, apply a voltage of +2 V to the first diffusion region 202 and apply a voltage of +2 V to the gate electrode 205. As apparent, the information stored in the second memory function body 222 can be read by exchanging the source and drain regions reversely to the case where the information stored in the first memory function body 221 is read.

By the aforementioned operation method, selective 2-bit write and erase per memory element is achieved.

Embodiment 5

As with Embodiment 4, a semiconductor storage device in Embodiment 5 has two memory function bodies set on both sides of a gate electrode, and Embodiment 5 is different from Embodiment 4 only in the location of impurity atoms that can cause an intrinsic semiconductor to be of the second conductivity type. As for the location of such impurity atoms, Embodiment 5 conforms to Embodiment 2. It should be understood, therefore, that what has been described in connection with Embodiments 2 and 4 shall apply to Embodiment 5 without particular description here.

Figure 9:
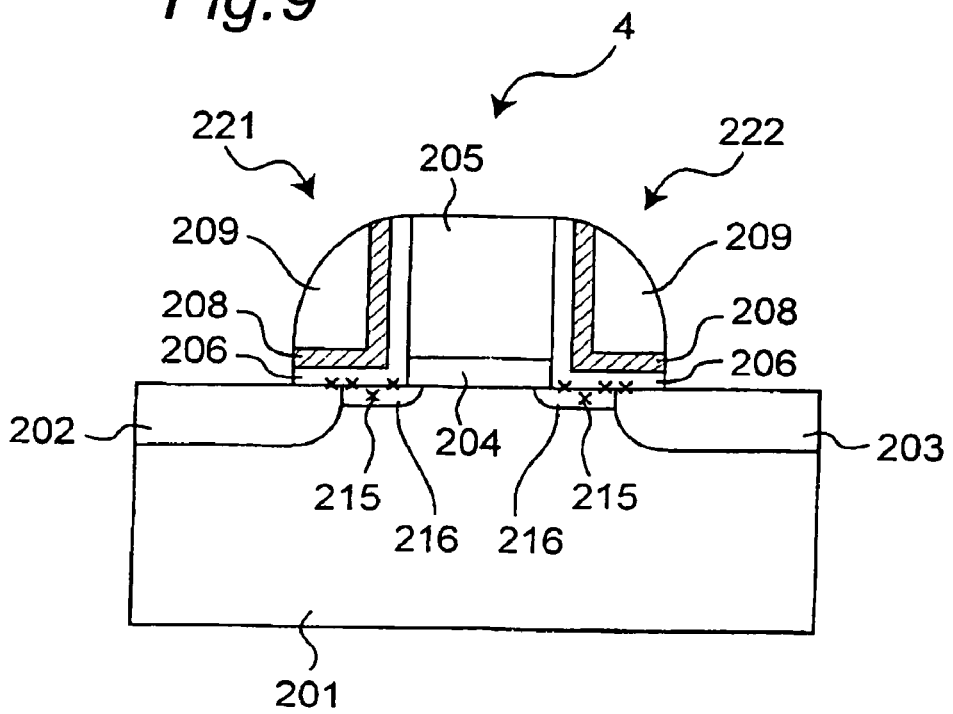
FIG. 9 is schematic cross sectional view showing a semiconductor storage device in Embodiment 5 of the present invention.

In FIG. 9 explaining the semiconductor storage device of Embodiment 5, constituent parts identical to those of the semiconductor storage device (FIG. 8) in Embodiment 4 are denoted by the same reference numerals and detailed description thereof will be omitted.

As shown in FIG. 9, in a memory element 4 in Embodiment 5, a semiconductor layer (silicon substrate) 201 has, in the vicinity of its interface with a bottom is insulating film 206 serving as a charge retention insulator (first insulator), a region 216 containing phosphorus atoms as an impurity that would cause intrinsic semiconductors to be of the second conductivity type. In other words, the phosphorus atoms are present in a part of a first conductivity type (P type) region in the semiconductor layer which is shallower than a preset depth from the interface between the charge retention insulator (bottom insulating film) 206 and the semiconductor layer 201. Herein, it is appropriate to define the preset depth as 10 nm as with Embodiment 2. In such a case, the phosphorus atoms 215 are also present in the interface between the bottom insulating film 206 and the silicon substrate 201. As a matter of course, the phosphorus atoms may exist in a region away by 10 nm or more from the interface between the bottom insulating film 206 and the semiconductor layer.

Also in Embodiment 5, the presence of the phosphorus atoms 215 in the interface between the silicon substrate 201 and the bottom insulating film 206 in each of the memory function bodies 221, 222 as well as in the region 216 of the silicon substrate brings about actions and effects similar to those in Embodiment 2.

The inventors of the present invention have confirmed that the presence of the region 216 containing phosphorus provides an effect of suppressing deterioration of read current when the memory element 9 repeats the write operation and the erase operation.

Figure 10:
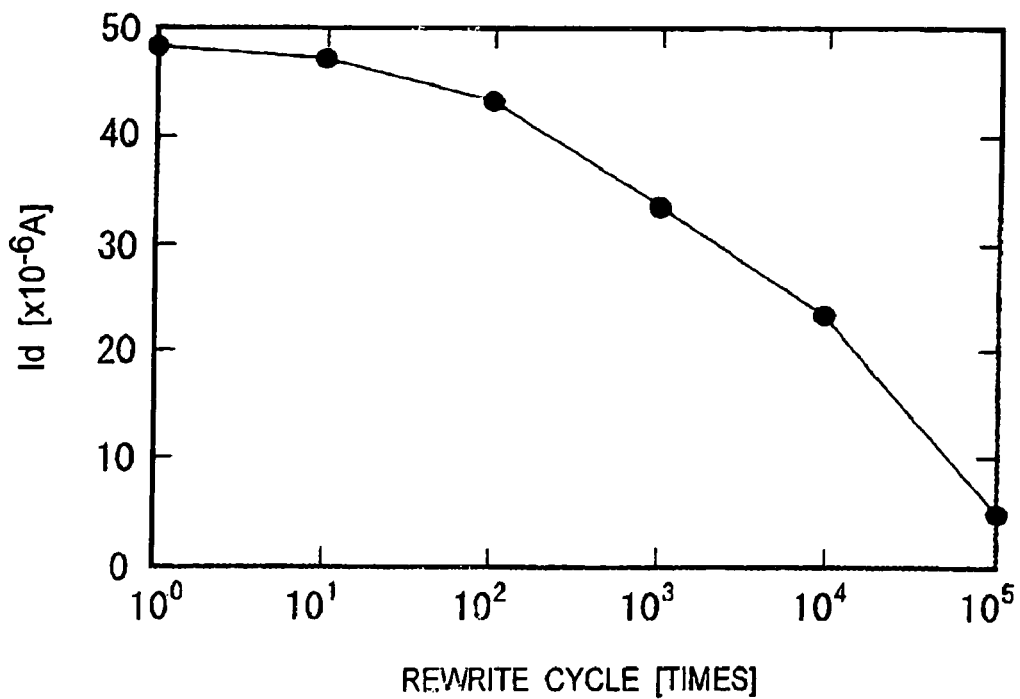
FIG. 10 is a graph showing a relation between the read current and the number of rewrite operations after erase operation in a semiconductor storage device that has a rewrite cycle, the device having no region containing phosphorus in a semiconductor layer in the vicinity of an interface with the charge retention insulator.
Figure 11:
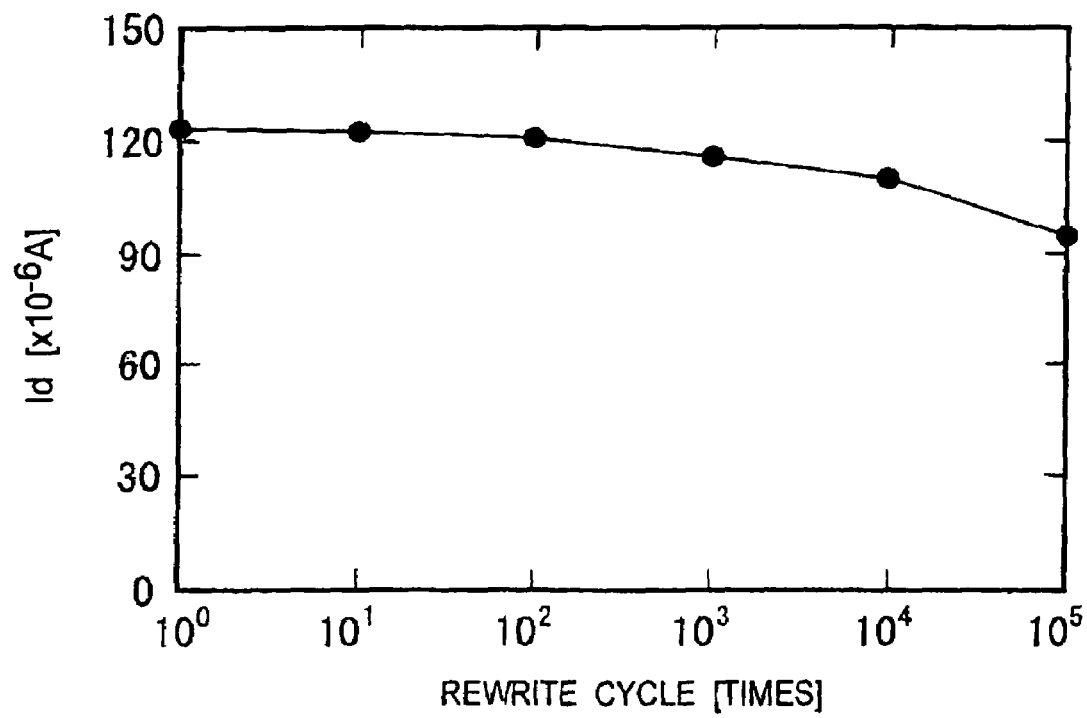
FIG. 11 is a graph showing a relation between the read current and the number of rewrite operations after erase operation in a semiconductor storage device that has a rewrite cycle, the device having a region containing phosphorus in a semiconductor layer in the vicinity of an interface with the charge retention insulator.

FIGS. 10 and 11 show measurement results when a rewrite cycle consisting of a write operation and an erase operation is repeated in a memory element with the region 216 containing phosphorus and in a memory element without the region 216, showing a relation between the read current subsequent to the erase operation and the number of rewrite operations.

In the memory element without the region 216 containing phosphorus, the read current subsequent to an erase operation after the rewrite cycle consisting of a write operation and an erase operation was executed $10^5$ times was approx. 1/10 of the read current before execution of the rewrite cycle. Thus, the reduction in read current subsequent to an erase operation decreases a memory window. Therefore, as the rewrite cycle increases, the memory window decreases and thereby the read speed is reduced, or the rewrite cycle must be limited in order to maintain a specified read speed.

The reduction in read current due to the rewrite cycle as shown in FIG. 10 is considered to be attributed to deterioration of the subthreshold coefficient and degradation of the transconductance caused by an interface state generated in an interface between the silicon oxide film and the semiconductor substrate and by electric charge trap generated in the silicon oxide film.

FIG. 11 shows a measurement result regarding a relation between the read current subsequent to an erase operation and the number of rewrite operations when the rewrite cycle is applied to the memory element 4 with the region 216 containing phosphorus.

In the memory element 4 with the region 216 containing phosphorus, a drain current subsequent to an erase operation after the rewrite cycle is executed $10^5$ times was approx. 75% of the drain current before execution of the rewrite cycle. More particularly, in the memory element with the region 216 containing phosphorus, a reduction rate of the read current subsequent to an erase operation is as small as approx. 25%, exhibiting drastic improvement.

As is clear form the result, with the region 216 containing phosphorus being formed, the decrease in memory window due to the rewrite operations is suppressed, which in turn increases the read speed and increases the allowable number of rewrite cycles.

Embodiment 6

Figure 12:
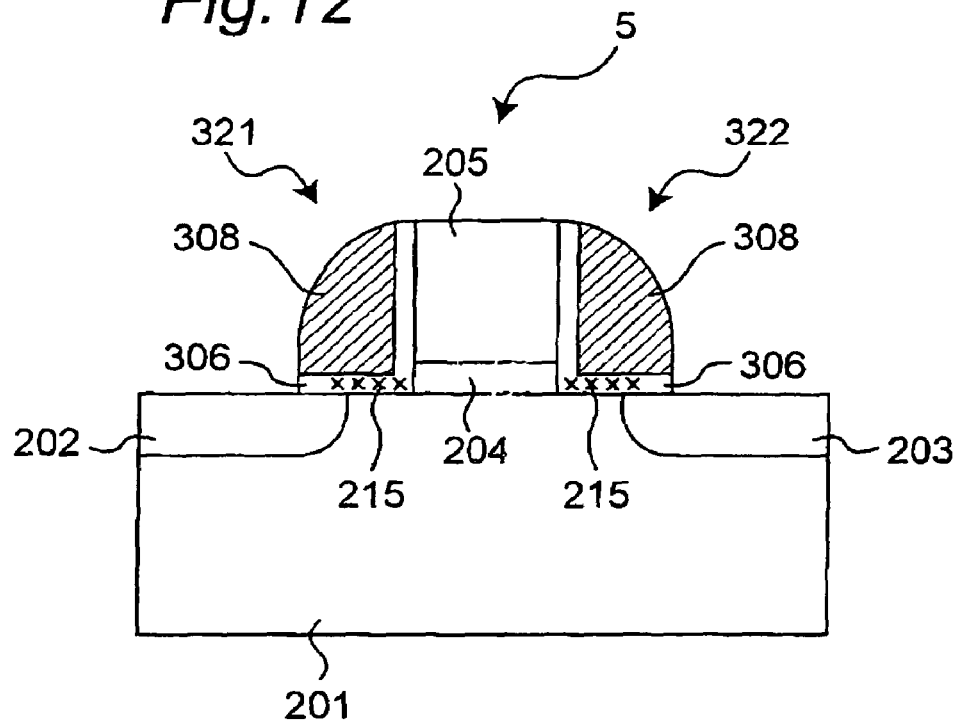
FIG. 12 is schematic cross sectional view showing a semiconductor storage device in Embodiment 6 of the present invention.

A semiconductor storage device in Embodiment 6 is identical to the semiconductor storage device in Embodiment 4 except for the structure of a memory function body set on a lateral wall of the gate electrode. In FIG. 12 explaining the semiconductor storage device in Embodiment 6, constituent parts identical to those of the semiconductor storage device (FIG. 8) in Embodiment 4 are denoted by the same reference numerals and detailed description thereof will be omitted.

Memory function bodies 321, 322 in a memory element 5 that is the semiconductor storage device in Embodiment 6 are each composed of a bottom insulating film 306 serving as a charge retention insulator (first insulator) and a silicon nitride film 308 serving as a charge storage insulator (second insulator).

Also in Embodiment 6, the bottom insulating film 306 serving as a charge retention insulator contains phosphorus atoms 215. This brings about actions and effects similar to those in Embodiment 4. Further, compared to the semiconductor storage device in Embodiment 4, the memory function bodies have simple structures, which allows reduction in the number of manufacturing process steps and reduction in costs.

Embodiment 7

A semiconductor storage device in Embodiment 7 is identical to the semiconductor storage device in Embodiment 4 except for the structure of a memory function body set on a lateral wall of the gate electrode.

Figure 13:
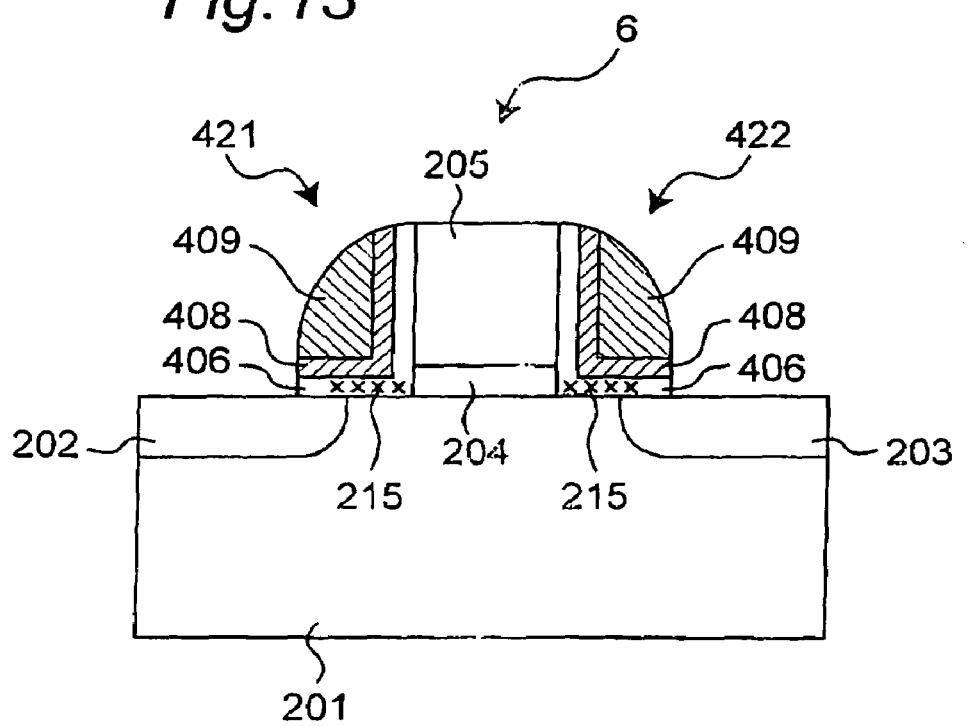
FIG. 13 is schematic cross sectional view showing a semiconductor storage device in Embodiment 7 of the present invention.

In FIG. 13 illustrating the semiconductor storage device in Embodiment 7, constituent parts identical to those of the semiconductor storage device (FIG. 8) in Embodiment 4 are denoted by the same reference numerals and detailed description thereof will be omitted.

Memory function bodies 421, 422 in a memory element 6 that is the semiconductor storage device in Embodiment 7 are structured such that an L-shaped silicon nitride film 408 serving as a charge storage insulator (second insulator) is interposed between an L-shaped bottom insulating film 406 serving as a charge retention insulator (first insulator) and a conductor 409. When operating the memory element, a voltage identical to that of the gate electrode 205 or a voltage independent of the voltage of the gate electrode 205 may be applied to the conductor 409, or the potential of the conductor 409 may be made to follow the potential of the gate electrode 205 with use of capacitive coupling of the conductor 409 and the gate electrode 205. In the case of applying the same voltage to the conductor 409 and the gate electrode 205, the conductor 409 and the gate electrode 205 may be short-circuited with silicide and the like.

Also in this embodiment, the bottom insulating film 406 serving as a charge retention insulator contains phosphorus atoms 215. This brings about actions and effects similar to those in Embodiment 4. Further, since a laminated film composed of the silicon nitride film 408 serving as a charge storage insulator and the bottom insulating film 406 serving as a charge retention insulator is interposed between the silicon substrate 401 and the conductor 409, a sufficiently large electric filed can be applied to the laminated film. Therefore, considerable increase in speed of the rewrite operation can be achieved.

Embodiment 8

The present embodiment relates to a manufacturing method for the semiconductor storage device according to Embodiment 4 or 5.

Figure 14A:
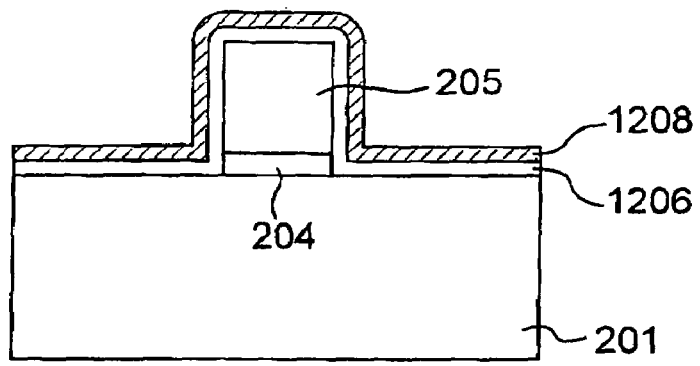
FIGS. 14A, 14B, and 14C are explanatory views showing a fabrication process of a semiconductor storage device in Embodiment 8 of the present invention.
Figure 14B:
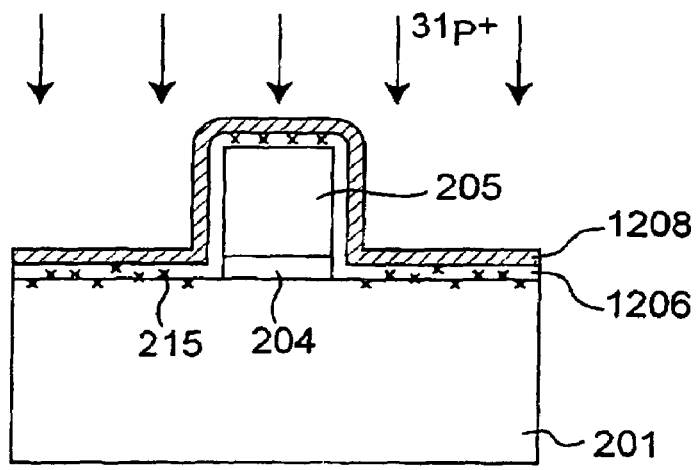
Figure 14C:
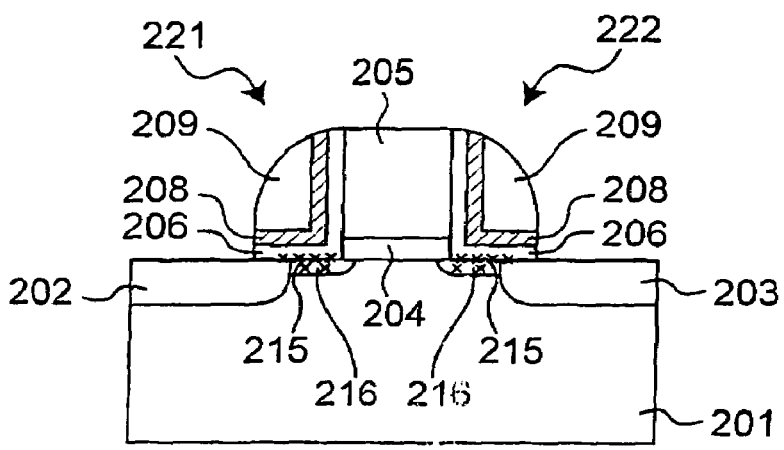

FIGS. 14A to 14C are views schematically showing an example of procedures to manufacture semiconductor storage devices.

First, as shown in FIG. 14A, a gate insulating film 204 and a gate electrode 205 are formed on a P type (first conductivity type) silicon substrate 201. Then, a silicon oxide film (first insulator) 1206 to be a bottom insulation film (charge retention insulator) 206 is formed by thermal oxidation. The silicon oxide film 1206 may be formed in the form of a silicon oxynitride film. Moreover, a further oxide film may be laminated on the thermal oxide film by CVD (Chemical Vapor Deposition). The silicon oxide film 1206 should be formed to have a thickness of, for example, 1.5-10 nm. Afterward, a silicon nitride film 1208 to be a charge storage insulator 208 is deposited by CVD. The silicon nitride film 1208 should be formed to have a thickness of, for example, 3-15 nm.

Next, as shown in FIG. 14B, with use of the same method as that in Embodiment 3 (FIG. 7B), $^{31}P^+$ ions are implanted through a laminated film consisting of the silicon oxide film 1206 and the silicon nitride film 1208 by the ion implantation method.

Next, as shown in FIG. 14C, after a silicon oxide film serving as a top insulating film 209 is further deposited on the silicon nitride film 1208 by CVD, the laminated film of the silicon oxide film/silicon nitride film/silicon oxide film are selectively etched back to form the memory function bodies 221, 222 having a side wall shape on the gate lateral sides.

It is considered that upon being subjected to activation annealing during formation of the diffusion regions 202, 203, the phosphorus atoms 215 present in the bottom insulating film 206 as well as in an interface between the bottom insulating film 206 and the silicon substrate 201 are made to operate to suppress formation of a defect which causes hole trap. Part of phosphorus injected in the ion implantation step is also present in the silicon substrate 201 and is activated by the activation annealing, whereby a region 216 containing phosphorus is formed.

In this embodiment, the implantation step of implanting the $^{31}P^+$ ions is executed after formation of the silicon oxide film 1206 serving as a charge retention insulator, more particularly, after formation of the silicon nitride film 1208 serving as a charge storage insulator, and before formation of the silicon oxide film (top insulating film 209) that is a third film. The timing of the implantation of $^{31}P^+$ ions is identical to the timing of the implantation of $^{31}P^+$ ion in Embodiment 3 in that the implantation is executed between a deposition step of the silicon nitride film serving as a charge storage insulator and a deposition step of the film formed thereon, although the material of the film is different. Therefore, the advantages attributed to the implantation timing of the $^{31}P^+$ ion described in connection with Embodiment 3 are also attained in Embodiment 8.

Moreover, the modifications and changes stated in connection with Embodiment 3 are also applicable to this embodiment.

It is to be noted that for a different film structure of the memory function bodies as in the case of Embodiment 6 or 7, if appropriate changes are made to materials and thickness of laminated films, manufacturing can be done by a method similar to the above-described method.

Embodiment 9

This embodiment is related to a memory cell array in which the memory elements according to Embodiment 4 or 5 are arranged.

Figure 19:
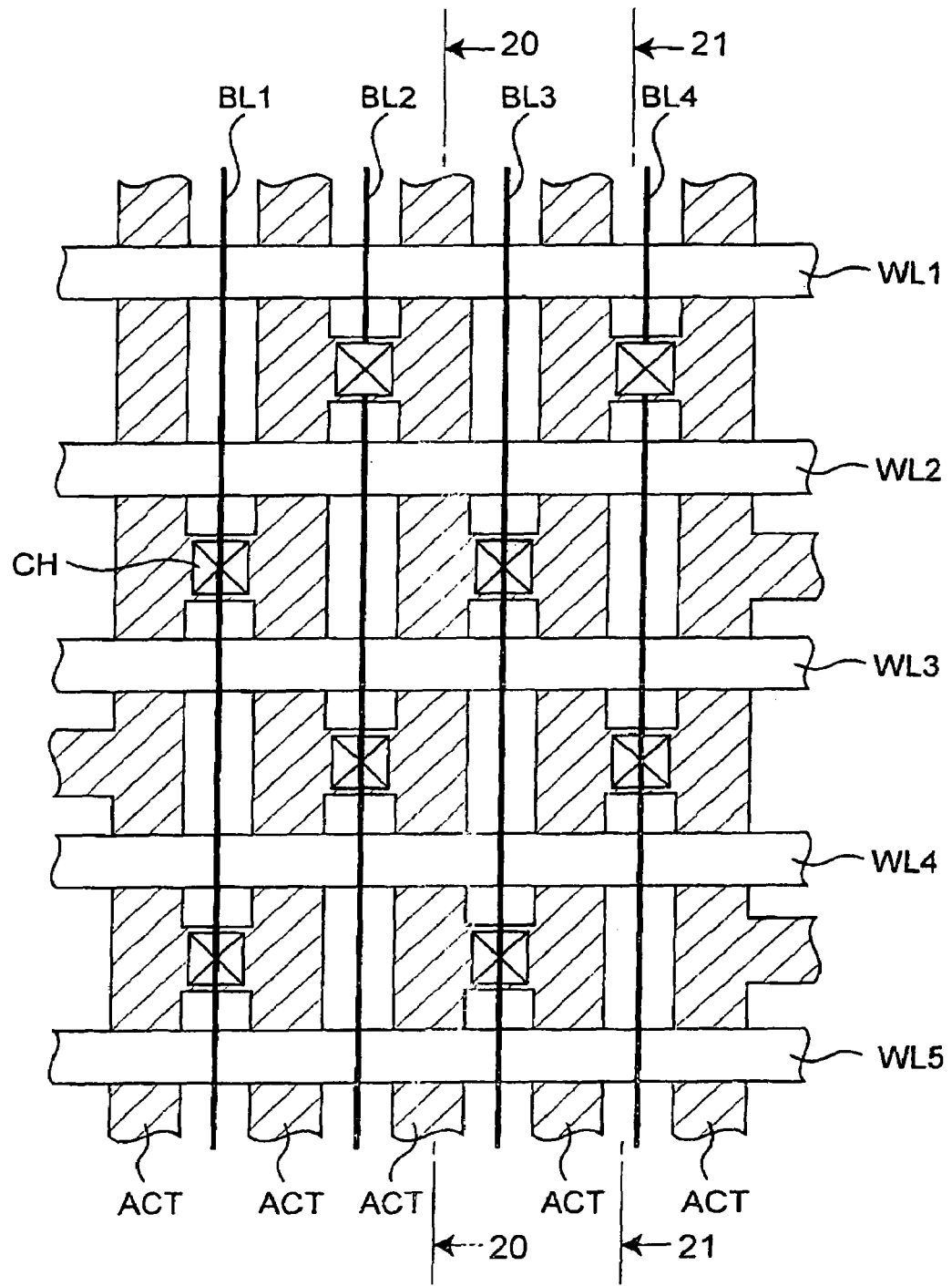
FIG. 19 is a plane view showing a memory cell array in which the semiconductor storage devices according to Embodiment 4 or 5 are used as memory cells.
Figure 20:
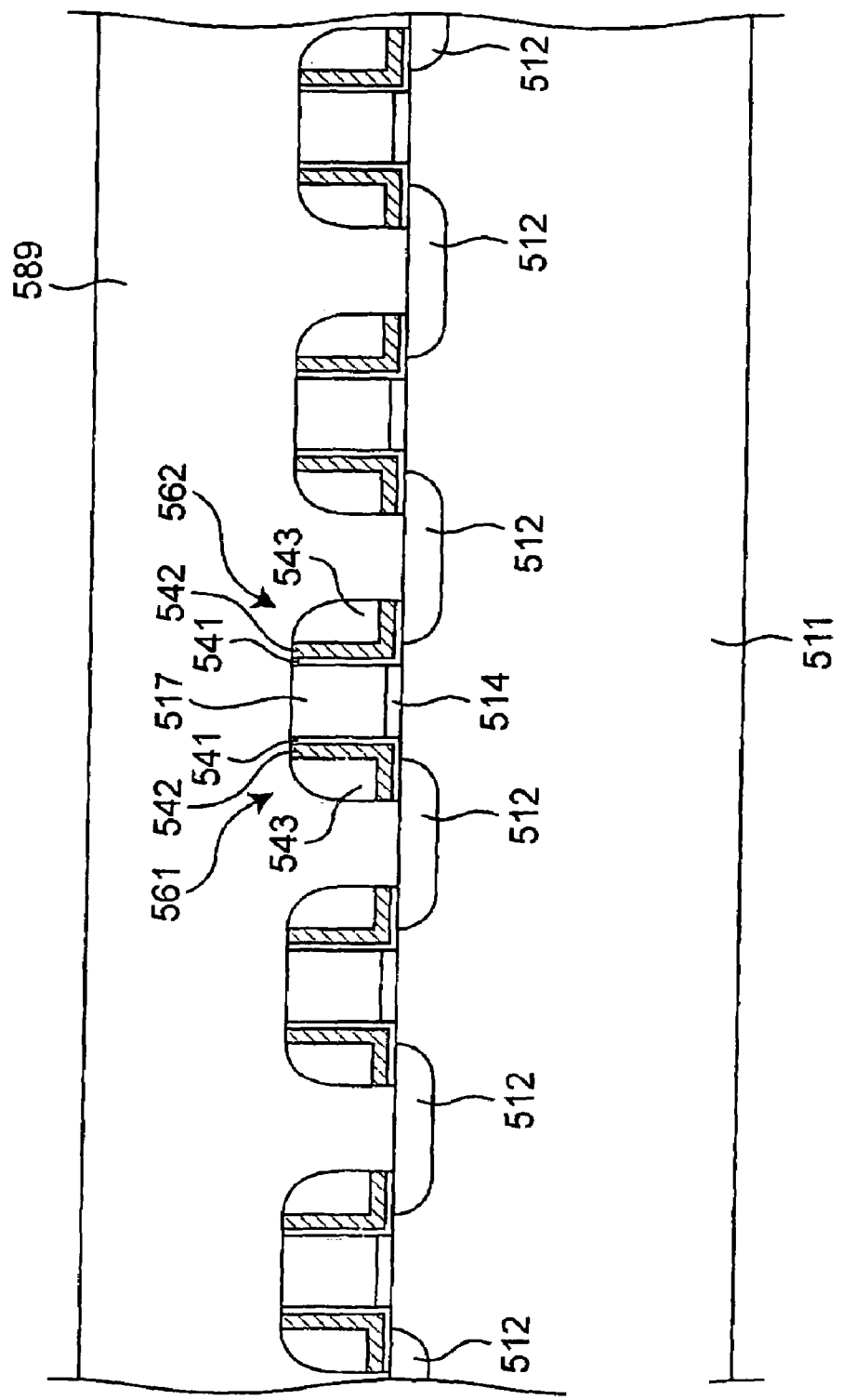
FIG. 20 is a cross sectional view taken along line 20-20 in FIG. 19.

FIG. 19 is a schematic plan view of the memory cell array. FIG. 20 is a schematic sectional view taken along the line 20-20 of FIG. 19. It is to be noted that the upper interconnection structure (bit lines) is expressed as a straight line in FIG. 19 for the sake of simplicity. Moreover, although FIG. 19 shows a memory cell array that includes five word lines and four bit lines, the number of rows and the number of columns can be set freely.

Figure 21:
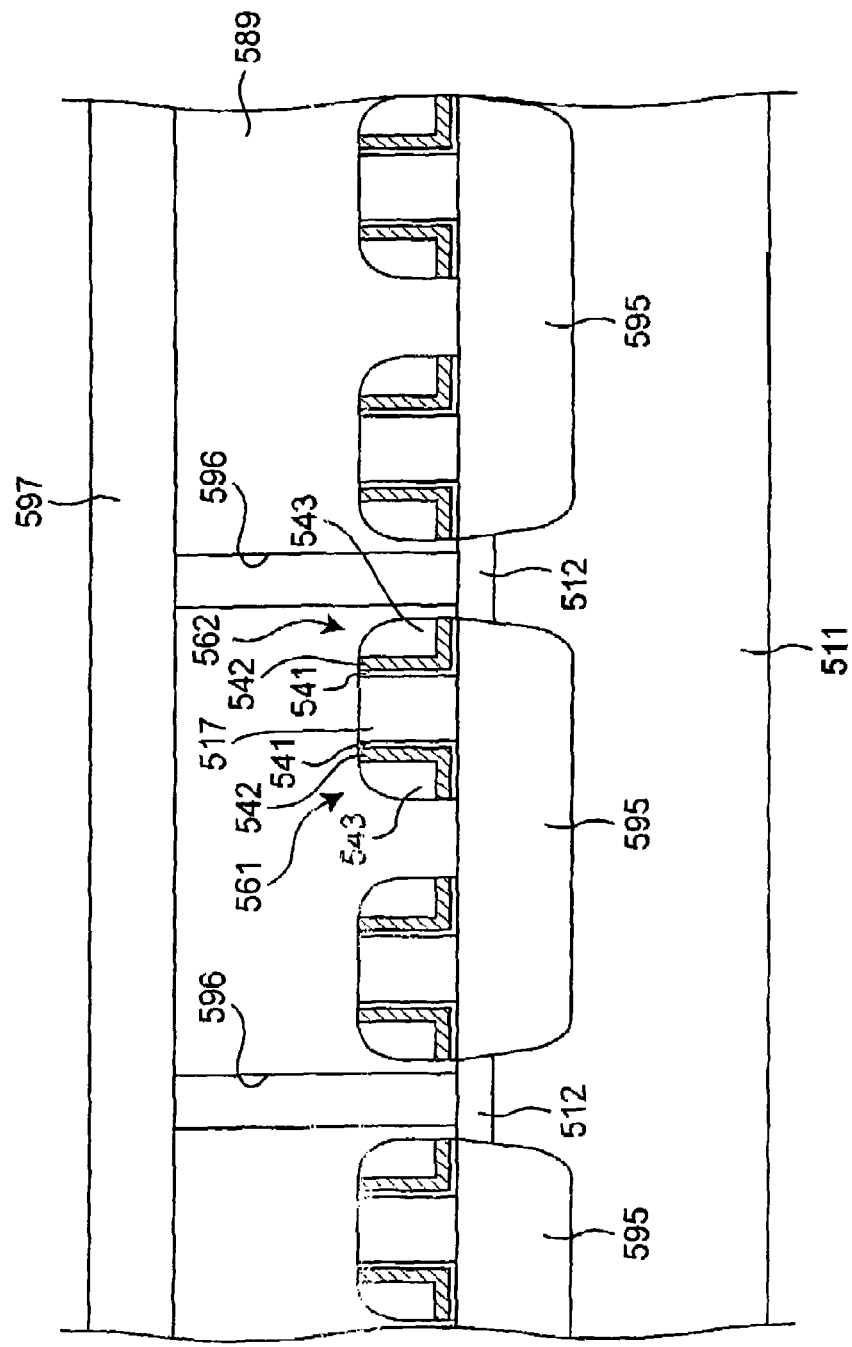
FIG. 21 is a cross sectional view taken along line 21-21 in FIG. 19.

Element isolation regions 595 (FIG. 21) are formed in a semiconductor substrate 511. A region of a surface of the semiconductor substrate 511 in which the element isolation regions 595 are not formed serves as an active region ACT. Word lines WL1 through WL5 (517) are extended in the transverse direction of the drawing sheet and arranged side by side in the longitudinal direction of the drawing sheet. Each of the word lines WL1 through WL5 (517) extends above the active regions ACT with a gate insulation film 514 therebetween, and diffusion layer regions 512 are formed on both sides of each word line (in a region that is in an active region and not covered with the word line). A word line (gate electrode) and two diffusion layer regions (source region or drain region) formed on both sides of the word line constitute one field-effect transistor. Memory function bodies 561 and 562, which have a silicon nitride film 542 held by silicon oxide films 541 and 543, are continuously formed on the sidewalls, or side surfaces, of the word lines WL1 through WL5 (517). As shown in FIG. 19, a line of the active region ACT, which extends in a direction intersecting the word lines, is connected to the adjacent lines of the active region ACT alternately between word lines. A contact hole CH (596) is formed on the connection portion of the mutually adjacent active regions ACT. Each contact hole CH (596) electrically connects any one of bit lines BL1 through BL4 (597) extended in the direction intersecting the word lines with the diffusion region 512. With the above arrangement, one diffusion layer region is shared by four field-effect transistors. Reference numeral 589 denotes a layer insulation film.

Figure 22:
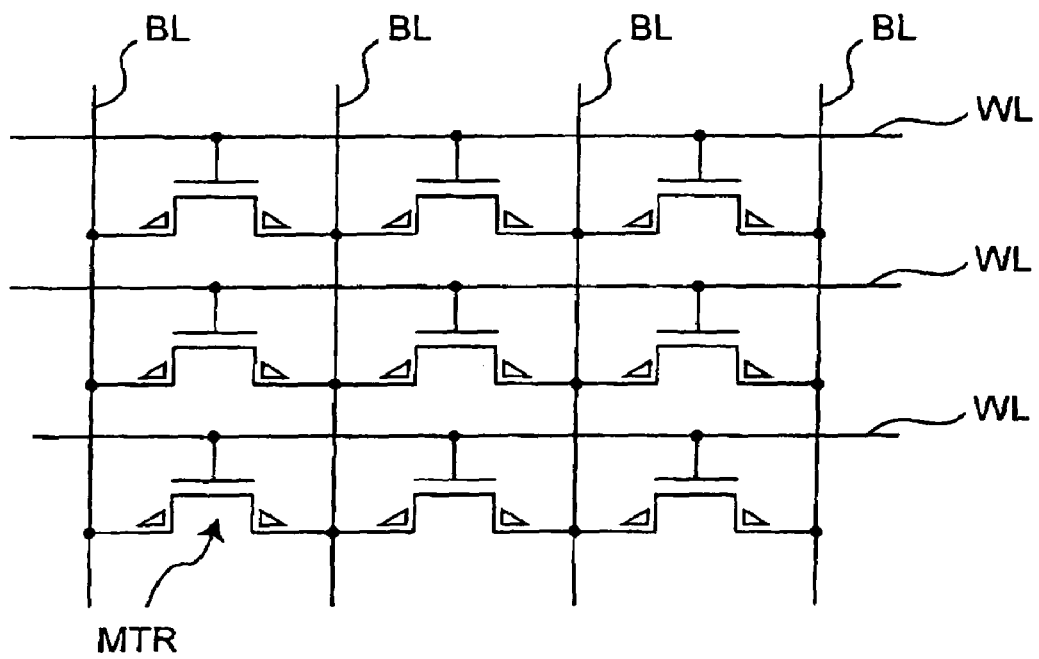
FIG. 22 is an equivalent circuit diagram of the memory cell array shown in FIG. 19.

FIG. 22 is a schematic equivalent circuit diagram of this memory cell array. Memory elements MTR are formed in an arrayed manner between mutually adjacent bit lines BL, while word lines WL extended in the direction intersecting the bit lines are connected with the gate electrodes of the memory elements. By selecting one pair of mutually adjacent bit lines and one word line, a specified memory element can be selected. By applying an appropriate voltage to the one pair of mutually adjacent bit lines and one word line, the rewrite operation and the read operation of the specified memory element can be executed. Since the concrete examples of the rewrite method and the read method for individual memory elements of the memory cell array have already been described in connection with Embodiment 9, no description thereof is provided here.

The word lines WL1 through WL5 serve as the gate electrodes of the memory elements on the respective active regions ACT. That is, each word line is shared by a plurality of memory elements. Moreover, two memory function bodies 561 and 562 are continuously formed on both sidewalls of each word line, and these memory function bodies 561 and 562 are shared by the plurality of memory elements. As described above, since each word line and the memory function bodies formed on the sidewalls of each word line are shared by a plurality of memory elements, it is possible to reduce the memory cell area and increase the packing density of the memory cell array.

Embodiment 10

Figure 23:
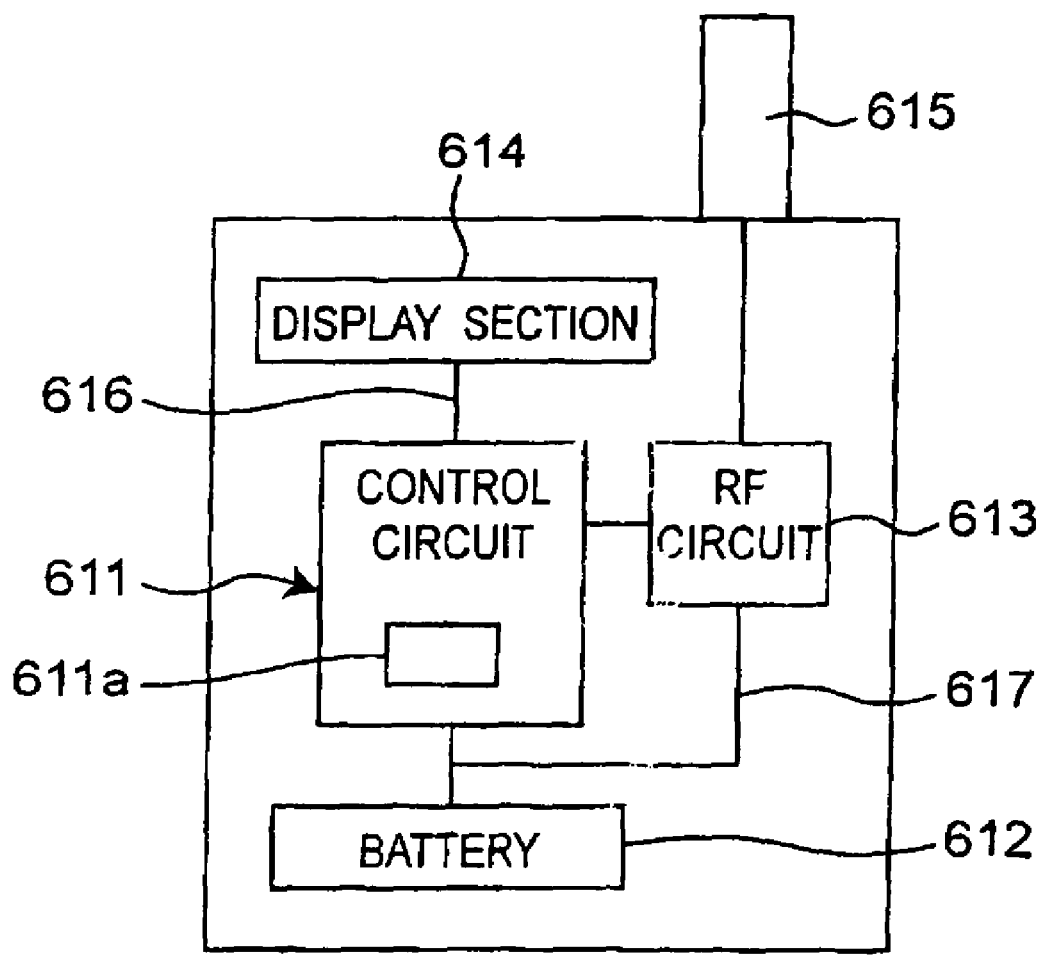
FIG. 23 is a block diagram showing a cell phone exemplifying portable electronic equipment in Embodiment 10 of the present invention.
Figure 24:
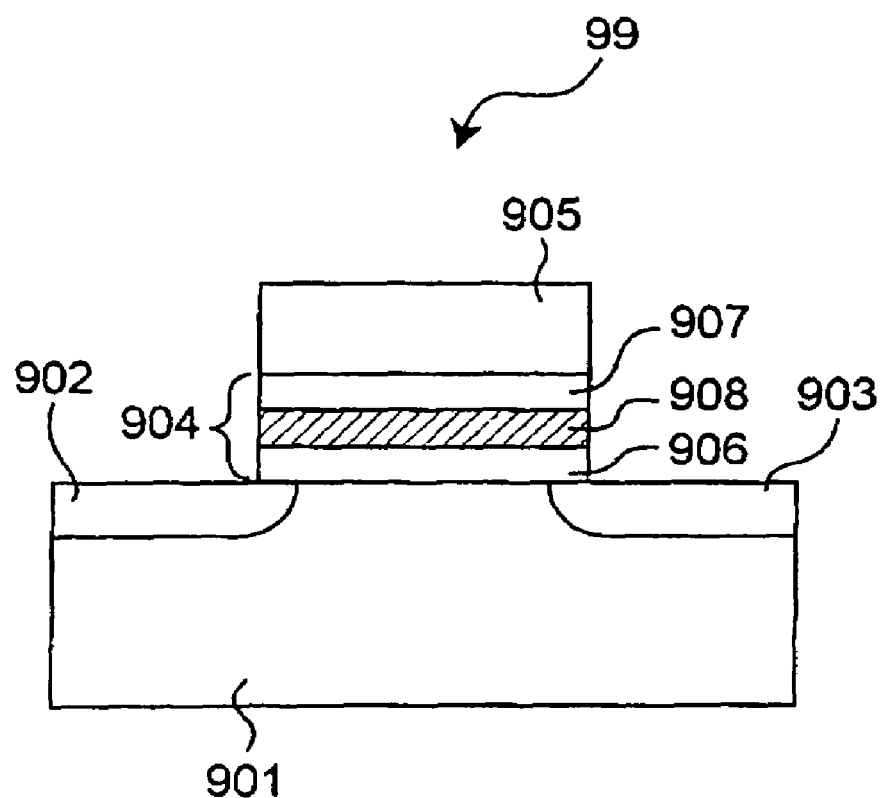
FIG. 24 is a schematic cross sectional view showing a prior art MONOS.
Figure 25:
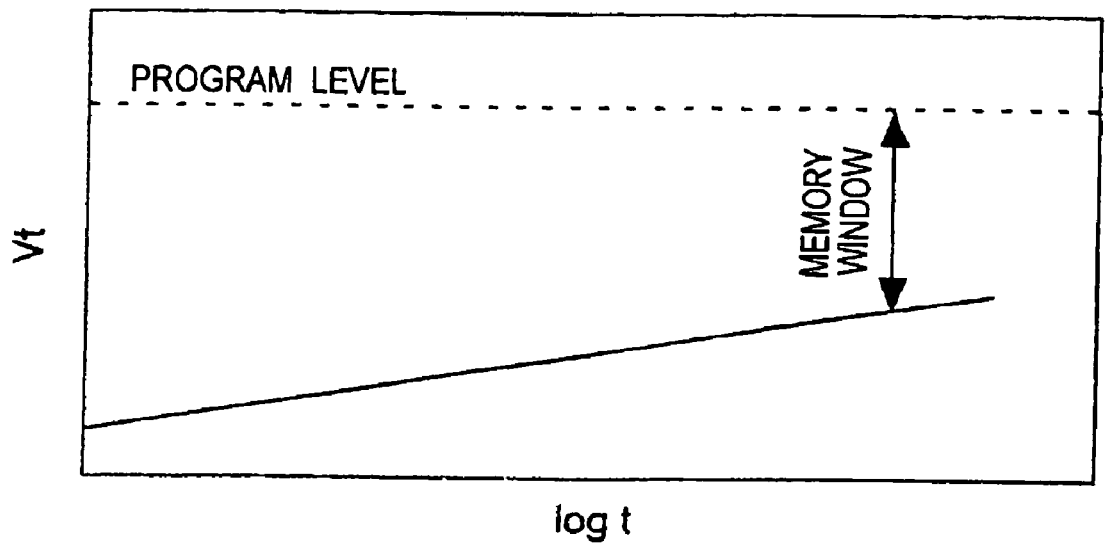
FIG. 25 is a graph schematically showing time (t) dependence of a threshold value (Vt) in the prior art MONOS after it is put in an erased state.
Figure 26:
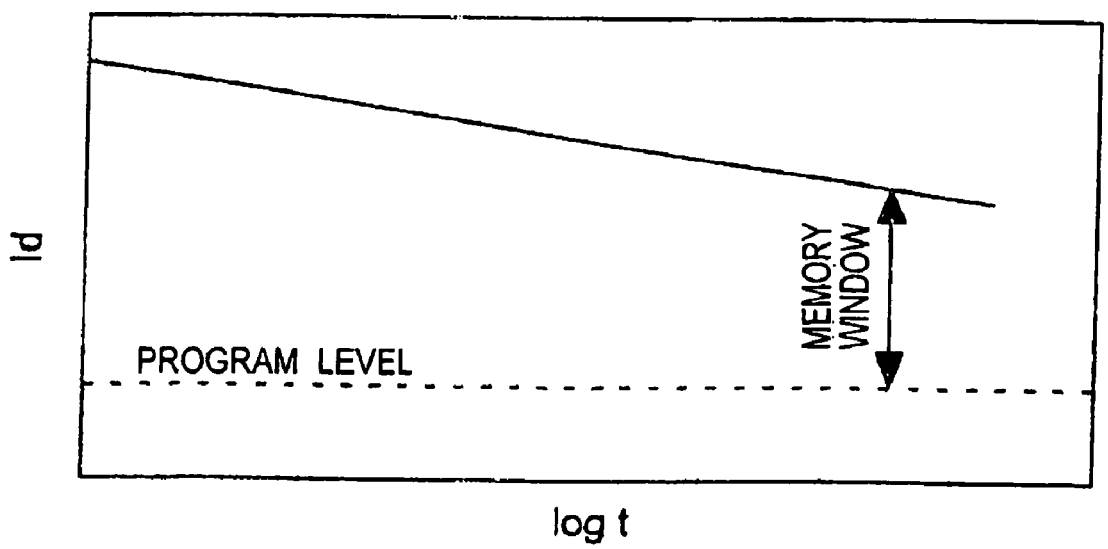
FIG. 26 is a graph schematically showing time (t) dependence of a read current (Id) in the prior art MONOS after it is put in the erased state.

FIG. 23 shows a schematic block diagram of a portable telephone as one example of the portable electronic equipment of the present invention.

This portable telephone is constituted essentially of a control circuit 611, a battery 612, an RF (Radio Frequency) circuit 613, a display section 614, an antenna 615, a signal line 616 and a power line 617. A semiconductor storage unit 611a including memory elements according to any one of Embodiments 1, 2, and 4-7 is incorporated in the control circuit 611. The control circuit 611 should preferably be an integrated circuit where devices of an identical structure are concurrently used as memory circuit elements and logic circuit elements. This facilitates the manufacturing of integrated circuits and allows the manufacturing cost of the portable electronic equipment to be especially reduced.

As described above, by employing the semiconductor storage device that facilitates the fabricating process for the memory section and the logic circuit section in combination, that is easy to miniaturize, and that allows a high speed read operation, it is possible to improve the reliability and operating speed of the portable electronic equipment, reduce the size of the portable electronic equipment, and reduce the production costs.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor storage device, comprising:
   a semiconductor layer having, at a surface portion thereof, a first conductivity type region and two second conductivity type regions separated from each other by the first conductivity type region;
   a memory function body formed on a surface of the semiconductor layer and having a function of storing electric charges; and
   a gate electrode provided above the first conductivity type region of the semiconductor layer,
   wherein the memory function body has a charge storage insulator having a function of storing electric charges, and a charge retention insulator positioned between the charge storage insulator and the semiconductor layer and having a function of retaining electric charges stored in the charge storage insulator, and
   wherein such impurity atoms as would cause an intrinsic semiconductor to be of the second conductivity type are present between the charge storage insulator and a preset depth location within the first conductivity type region of the semiconductor layer, wherein at least some of the impurity atoms are present in the charge retention insulator.

2. The semiconductor storage device according to claim 1, wherein the impurity atoms are present at a concentration in the charge retention insulator.

3. The semiconductor storage device according to claim 2, wherein the concentration of the impurity atoms is $10^{15}$-$10^{21}$ cm$^{-3}$.

4. The semiconductor storage device according to claim 1, wherein the impurity atoms are present at a concentration in a part of the first conductivity type region of the semiconductor layer, which part includes an interface between the semiconductor layer and the charge retention insulator and a region shallower than the preset depth from the interface.

5. The semiconductor storage device according to claim 4, wherein the concentration of the impurity atoms contained in the first conductivity type region becomes lower as a depth from the interface increases.

6. The semiconductor storage device according to claim 4, wherein the concentration of the impurity atoms contained in the first conductivity type region is $10^{15}$ cm$^{-3}$ or more and is less than a concentration of impurities contained in the first conductivity type to impart the fast conductivity type thereto.

7. The semiconductor storage device according to claim 1, wherein the first and second conductivity types are respectively a P type and an N type, and the impurity atoms are phosphorus atoms.

8. The semiconductor storage device according to claim 1, wherein the charge retention insulator is made of silicon oxide.

9. The semiconductor storage device according to claim 1, wherein the charge storage insulator is made of silicon nitride.

10. The semiconductor storage device according to claim 1, wherein the memory function body doubles as a gate insulating film and is provided between the gate electrode and the semiconductor layer in such a way that two opposite lateral portions of the memory function body are respectively positioned on the corresponding second conductivity type regions.

11. The semiconductor storage device according to claim 10, further comprising:

a first voltage feed section electrically connected to the first conductivity type region; and second and third voltage feed sections electrically connected to the two second conductivity type regions, respectively, wherein the first, The second and The third voltage feed sections apply voltages to each of the first conductivity type region and the two second conductivity type regions so that a reverse bias is applied to a junction between the first conductivity type region and the second conductivity type regions for executing an erase operation.

12. The semiconductor storage device according to claim 10, further comprising:

a first voltage feed section electrically connected to the first conductivity type region;

second and third voltage feed sections electrically connected to The two second conductivity type regions, respectively; and a fourth voltage feed section electrically connected to the gate electrode, and wherein the semiconductor storage device has a first write mode satisfying V2<V3, and a second write mode satisfying V2>V3, where V2 is a voltage produced by the second voltage feed section and V3 is a voltage produced by the third voltage feed section during a write operation.

13. The semiconductor storage device according to claim 1, wherein the memory function body comprises a first memory function body and a second memory function body, and the first and the second memory function bodies are provided on both sides of the gate electrode in such a way as to straddle boundaries between the first conductivity type region and each of the second conductivity type regions.

14. The semiconductor storage device according to claim 13, further comprising:

a first voltage feed section electrically connected to the first conductivity type region; and second and third voltage feed sections electrically connected to the two second conductivity type regions, respectively, wherein the first, the second and the third voltage feed sections apply voltages to each of the first conductivity type region and the two second conductivity type regions so that a reverse bias is applied to a junction between the first conductivity type region and the second conductivity type regions for executing an erase operation.

15. The semiconductor storage device according to claim 13, further comprising:

a first voltage feed section electrically connected to the first conductivity type region;

second and third voltage feed sections electrically connected to the two second conductivity type regions, respectively; and a fourth voltage feed section electrically connected to the gate electrode, and wherein the semiconductor storage device has a first write mode satisfying V2<V3, and a second write mode satisfying V2>V3, where V2 is a voltage produced by the second voltage feed section and V3 is a voltage produced by the third voltage feed section during a write operation.

* * * * *

UNITED STATES PATENT AND TRADEMARK OFFICE
CERTIFICATE OF CORRECTION

PATENT NO. : 7,598,559 B2  Page 1 of 1
APPLICATION NO. : 11/366479
DATED : October 6, 2009
INVENTOR(S) : Iwata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 482 days.

Signed and Sealed this

Fourteenth Day of December, 2010

David J. Kappos
*Director of the United States Patent and Trademark Office*